United States Patent
Onishi

(10) Patent No.: US 11,615,030 B2
(45) Date of Patent: Mar. 28, 2023

(54) CACHE MEMORY SYSTEM AND CACHE MEMORY CONTROL METHOD

(71) Applicant: Kioxia Corporation, Tokyo (JP)

(72) Inventor: Shohei Onishi, Kawasaki (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/304,117

(22) Filed: Jun. 15, 2021

(65) Prior Publication Data
US 2022/0083475 A1    Mar. 17, 2022

(30) Foreign Application Priority Data
Sep. 17, 2020    (JP) .............................. JP2020-156370

(51) Int. Cl.
G06F 12/0893    (2016.01)
G06F 12/084    (2016.01)
G06F 13/16    (2006.01)
G06F 12/02    (2006.01)
G06F 12/0831    (2016.01)

(52) U.S. Cl.
CPC ...... *G06F 12/0893* (2013.01); *G06F 12/0238* (2013.01); *G06F 12/084* (2013.01); *G06F 12/0833* (2013.01); *G06F 13/1668* (2013.01)

(58) Field of Classification Search
None
See application file for complete search history.

(56) References Cited

U.S. PATENT DOCUMENTS

| | | | |
|---|---|---|---|
| 6,408,345 B1* | 6/2002 | Fuoco | G06F 13/28 |
| | | | 711/E12.047 |
| 9,990,293 B2* | 6/2018 | Solihin | G11C 11/40607 |
| 10,223,273 B2 | 3/2019 | Yang et al. | |
| 11,263,125 B2* | 3/2022 | Saviotti | G06F 12/0868 |
| 2007/0239938 A1* | 10/2007 | Pong | G06F 12/0895 |
| | | | 711/E12.043 |
| 2017/0300419 A1 | 10/2017 | Yang et al. | |
| 2018/0285007 A1* | 10/2018 | Franklin | G06F 12/0246 |
| 2019/0221273 A1 | 7/2019 | Parkinson et al. | |
| 2019/0303226 A1 | 10/2019 | Kim et al. | |

* cited by examiner

*Primary Examiner* — Charles J Choi
(74) *Attorney, Agent, or Firm* — Oblon, McClelland, Maier & Neustadt, L.L.P.

(57) ABSTRACT

According to one embodiment, a cache memory system includes a cache memory and a cache controller. The cache memory can store first data to be read or written by a processor. The cache controller is configured to execute a refresh. The refresh includes reading the first data stored in the cache memory and writing the read first data to the cache memory. When executing the refresh, the cache controller is configured to exchange the first data stored in a first area of the cache memory for second data stored in a second area of the cache memory.

14 Claims, 19 Drawing Sheets

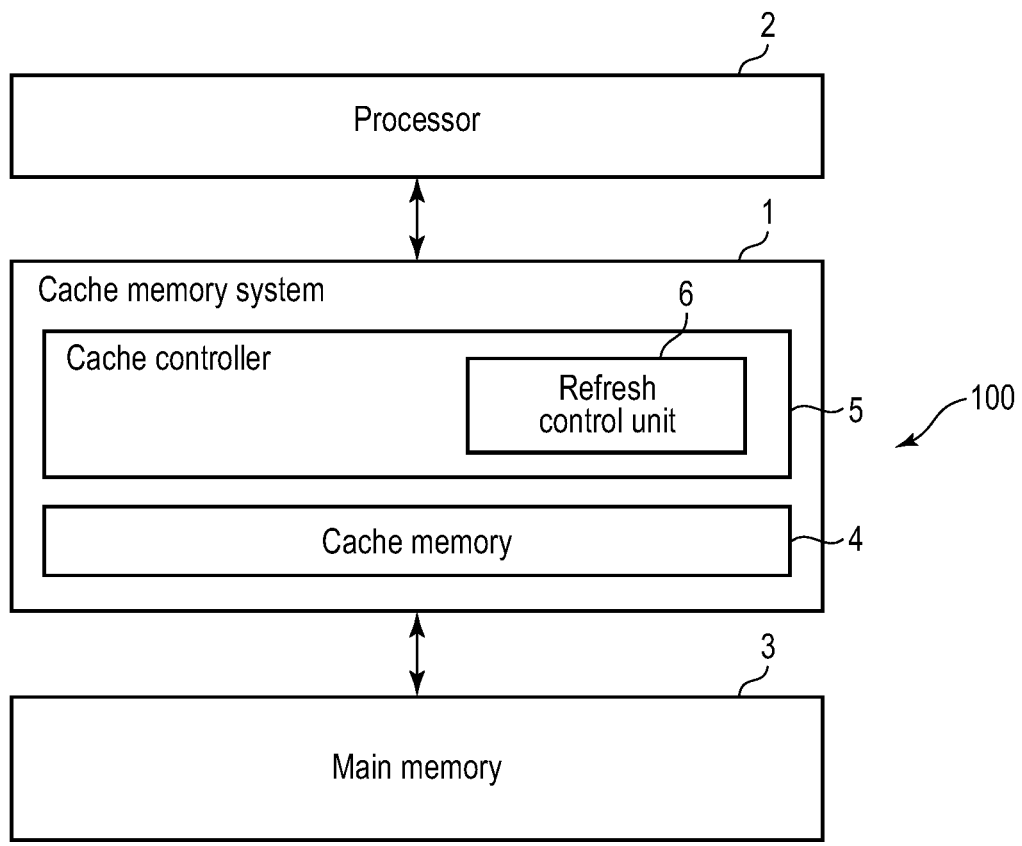
F I G. 1
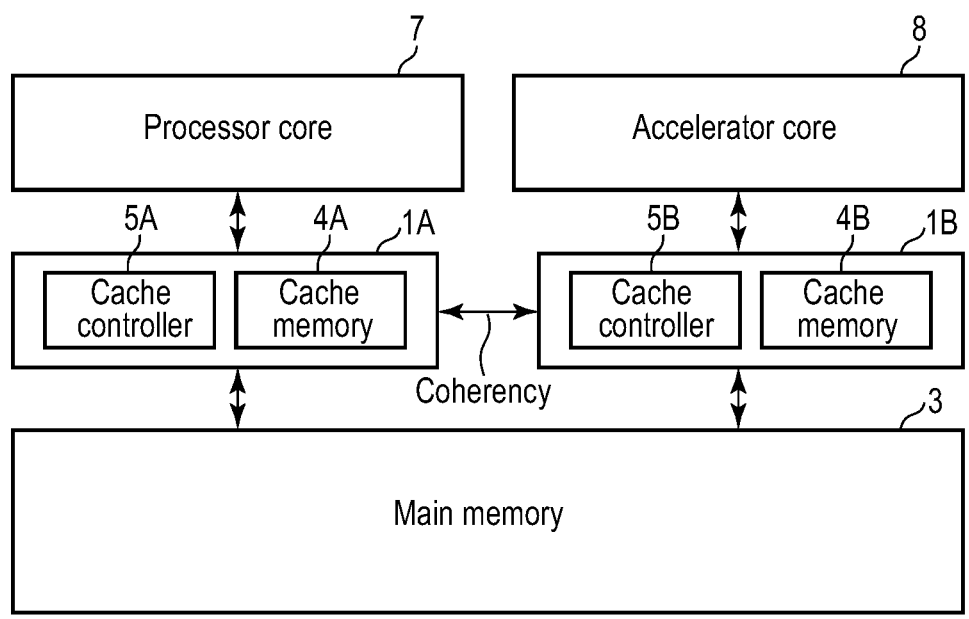
F I G. 2

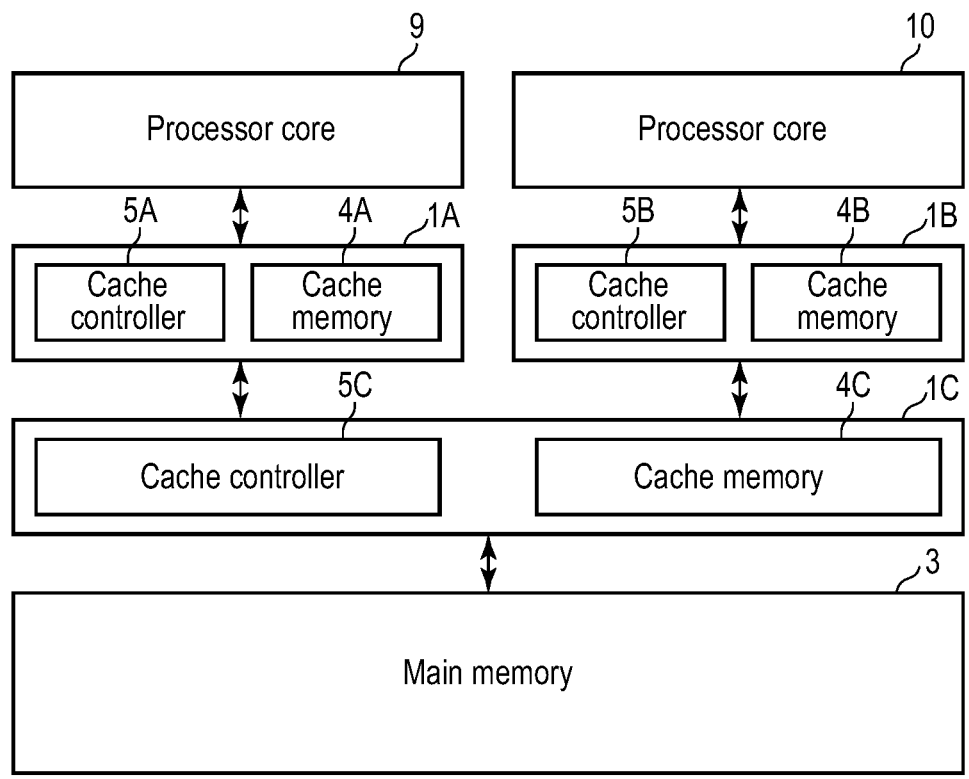
F I G. 3
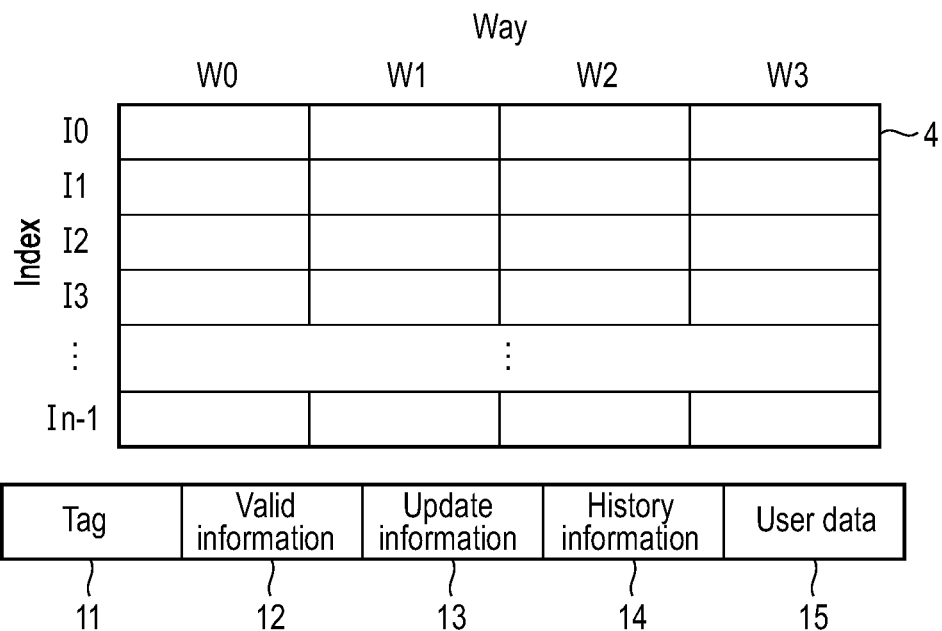
F I G. 4

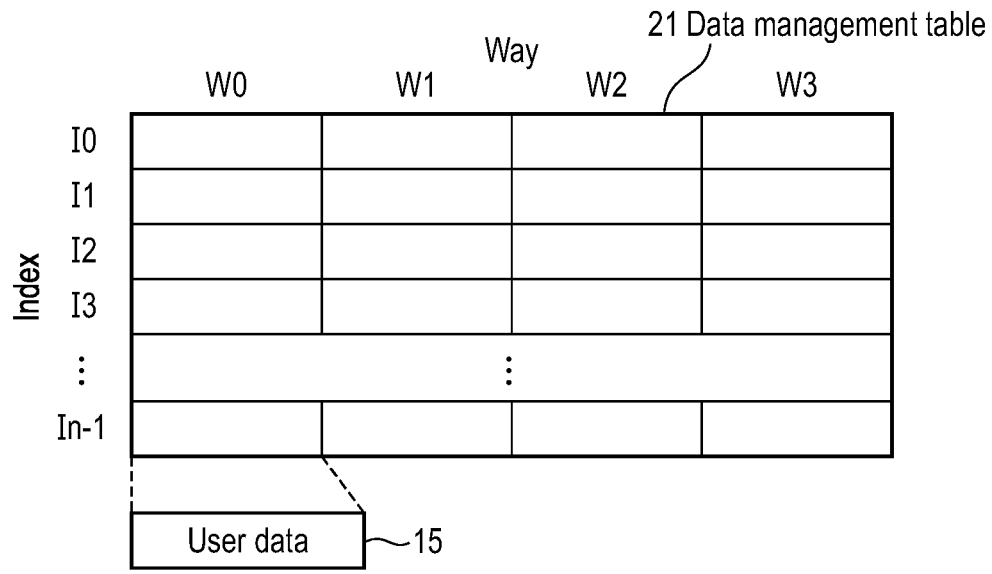
F I G. 7
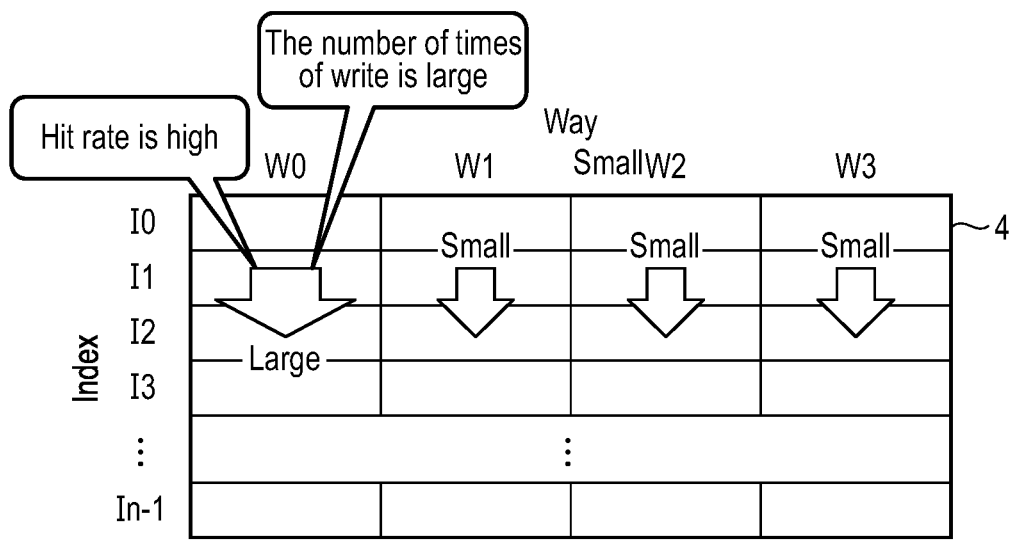
F I G. 8

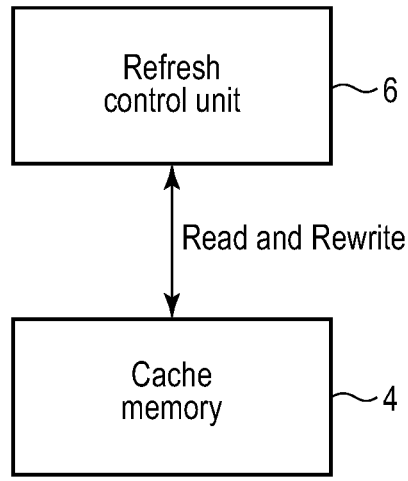
F I G. 9
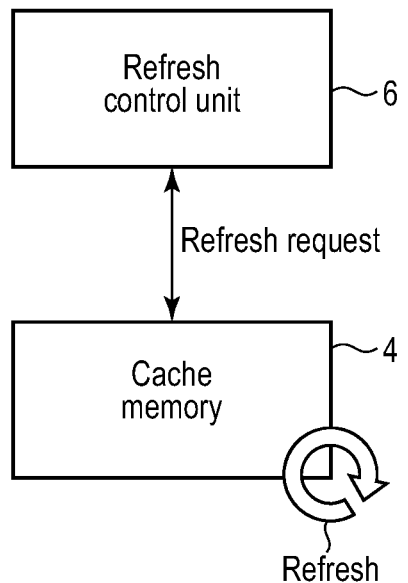
F I G. 10

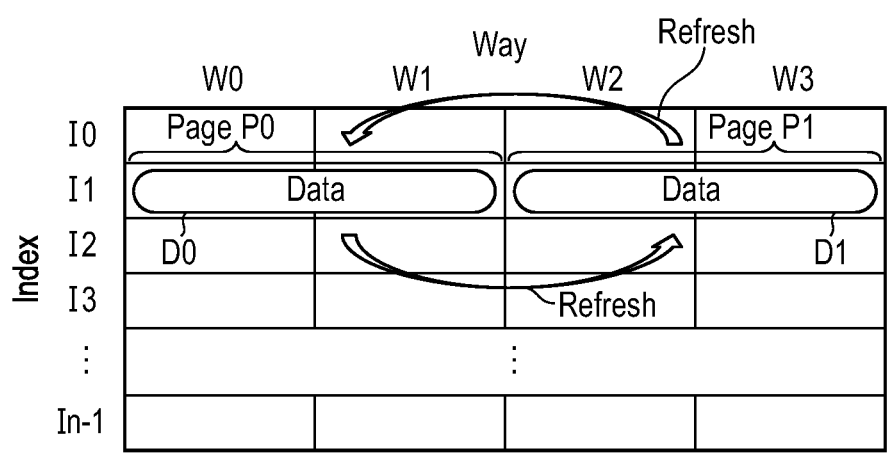
F I G. 13

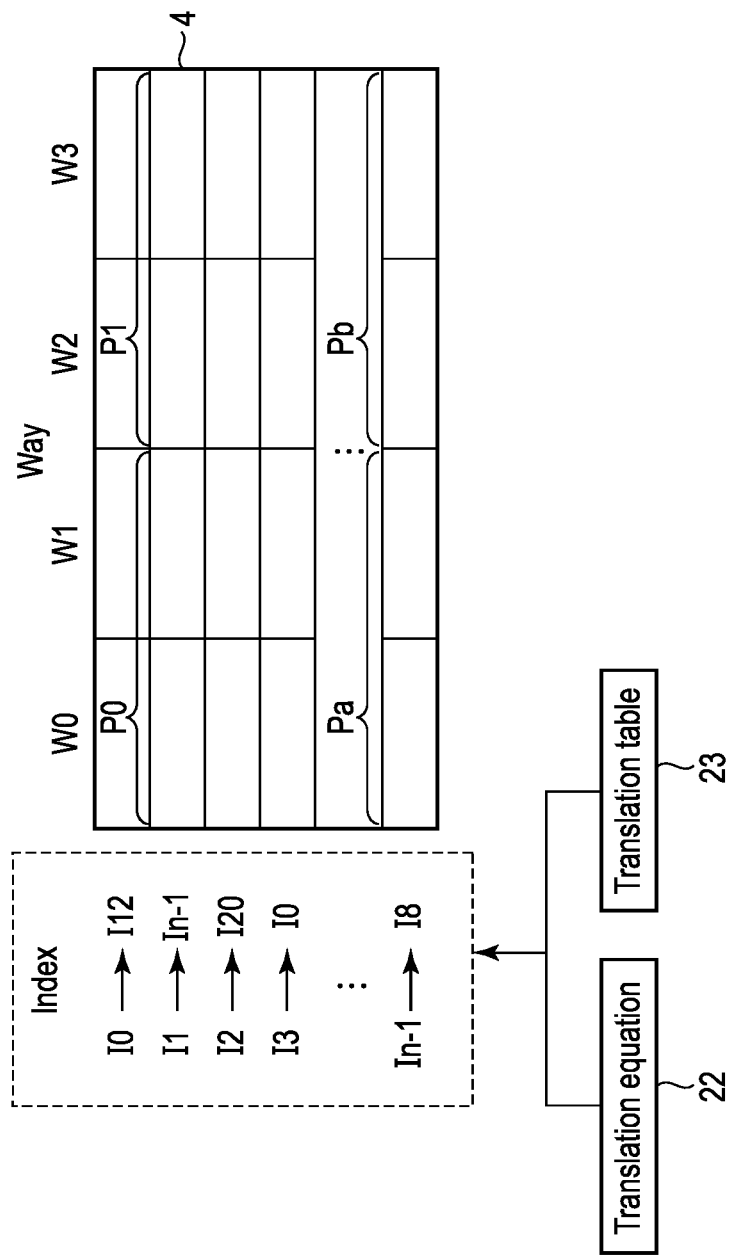
F I G. 14

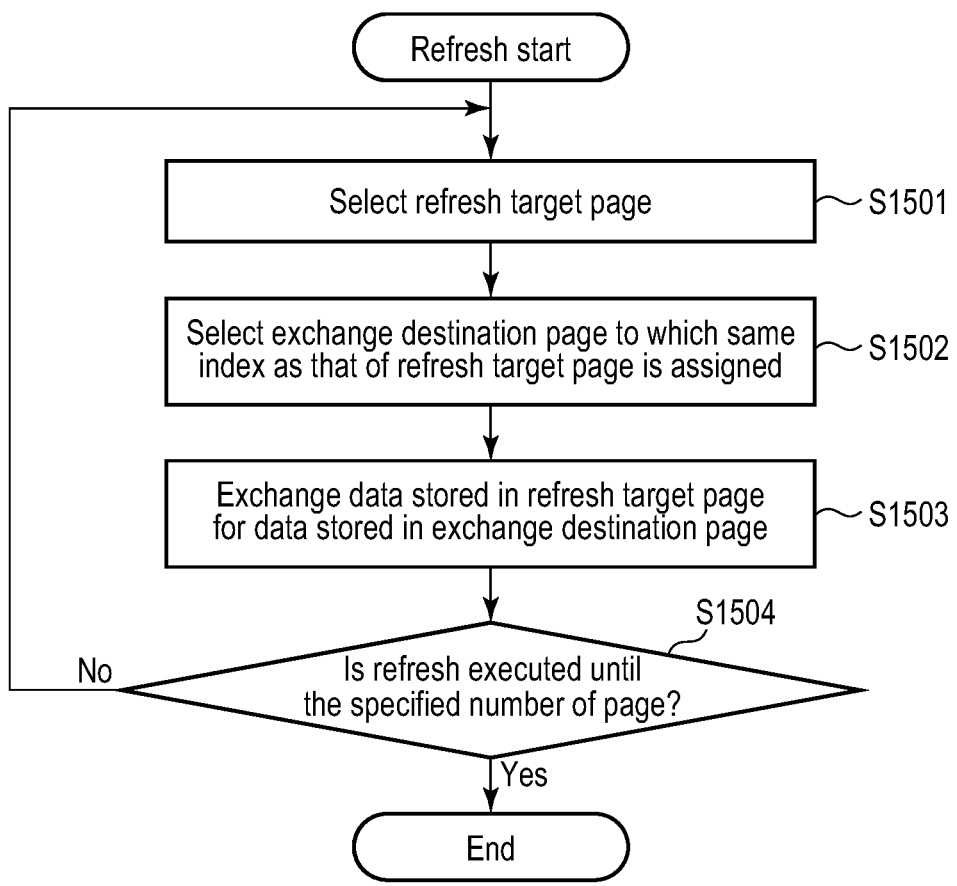
F I G. 15
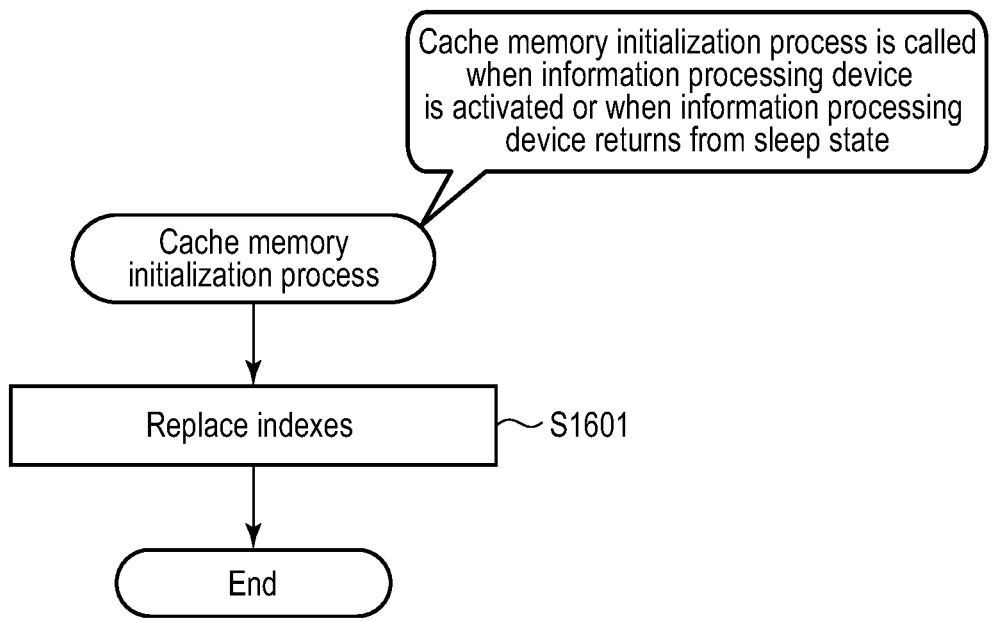
F I G. 16

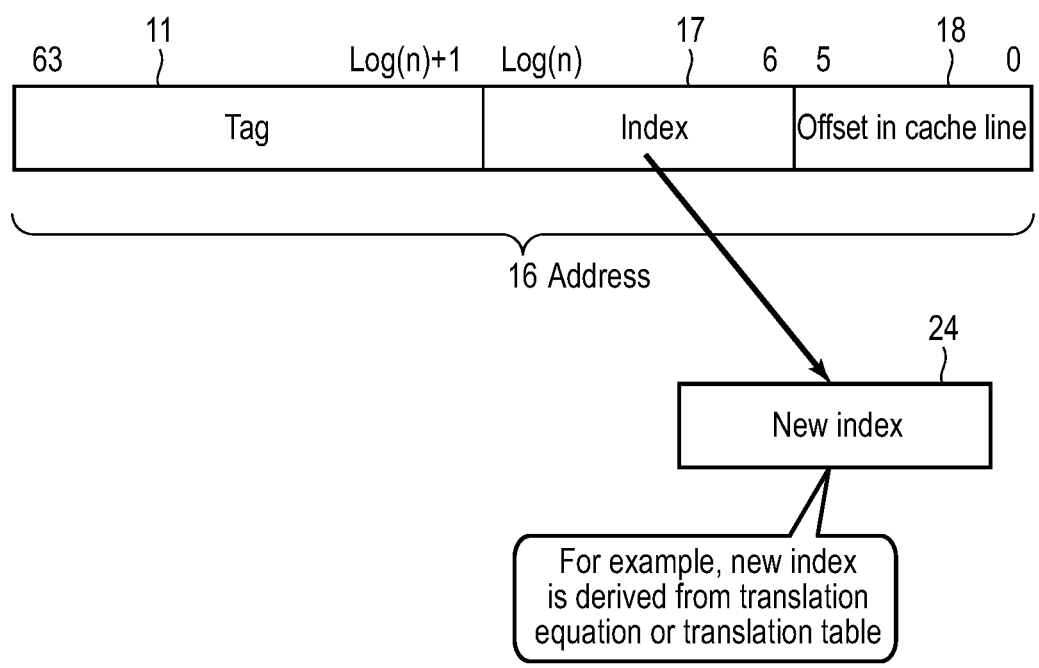
F I G. 17

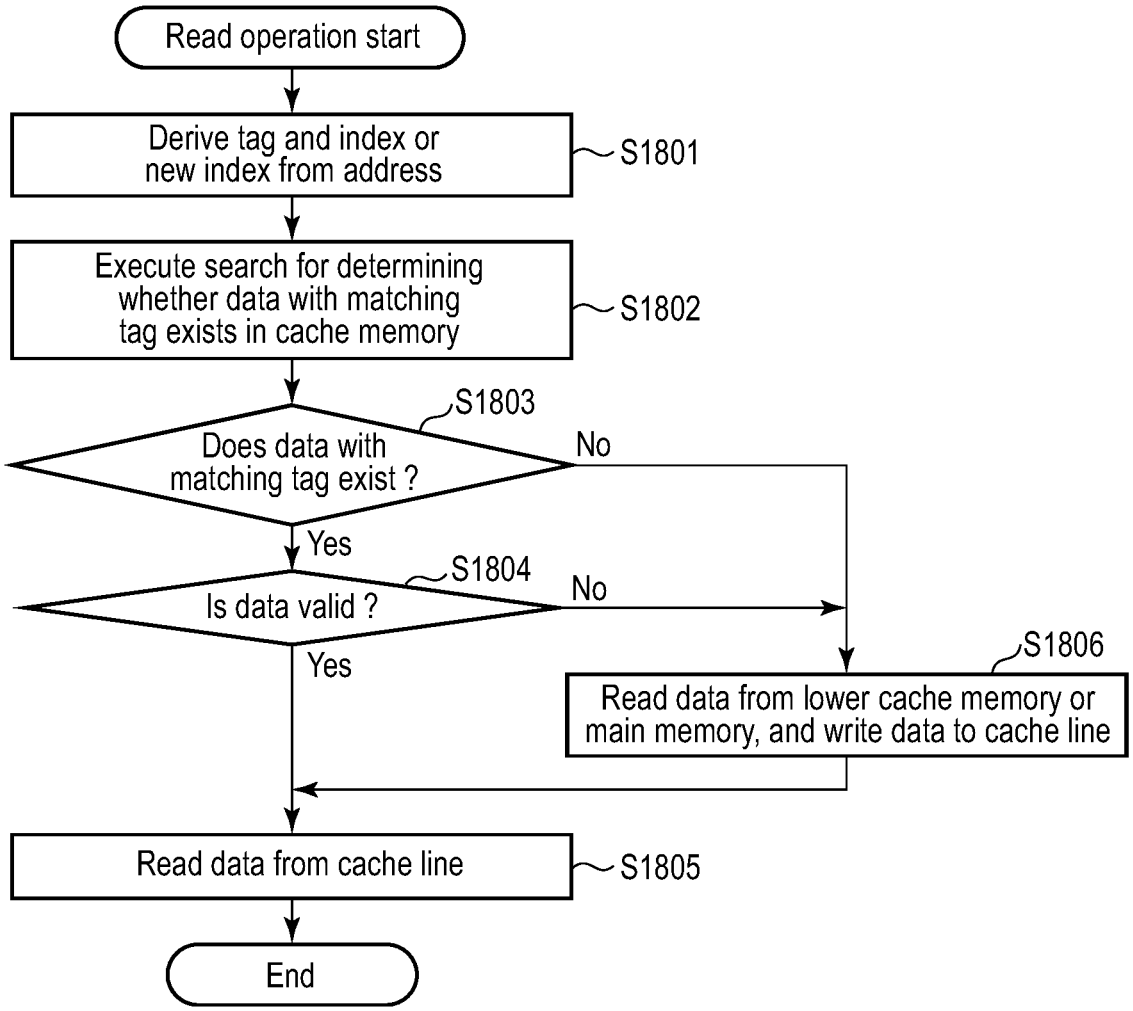
F I G. 18

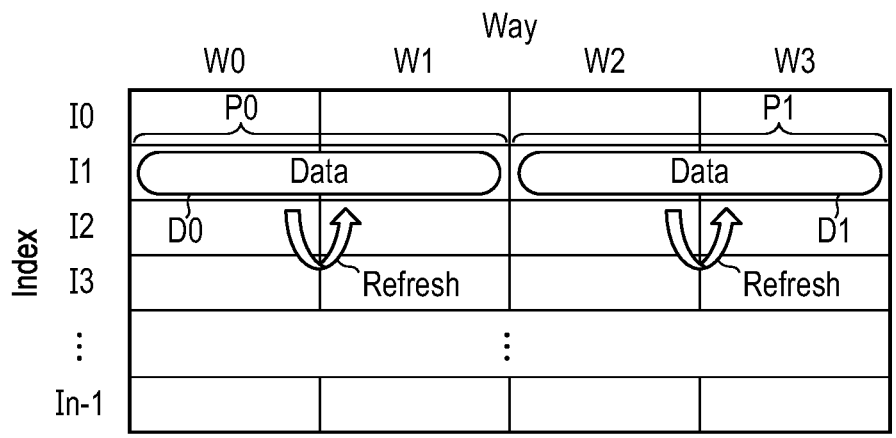
F I G. 20
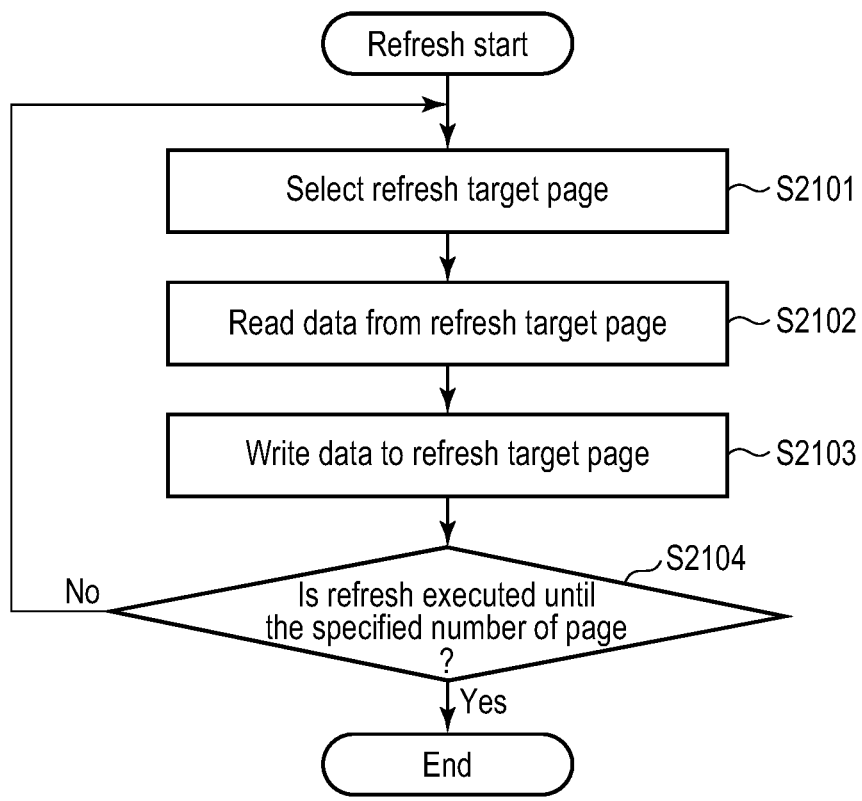
F I G. 21

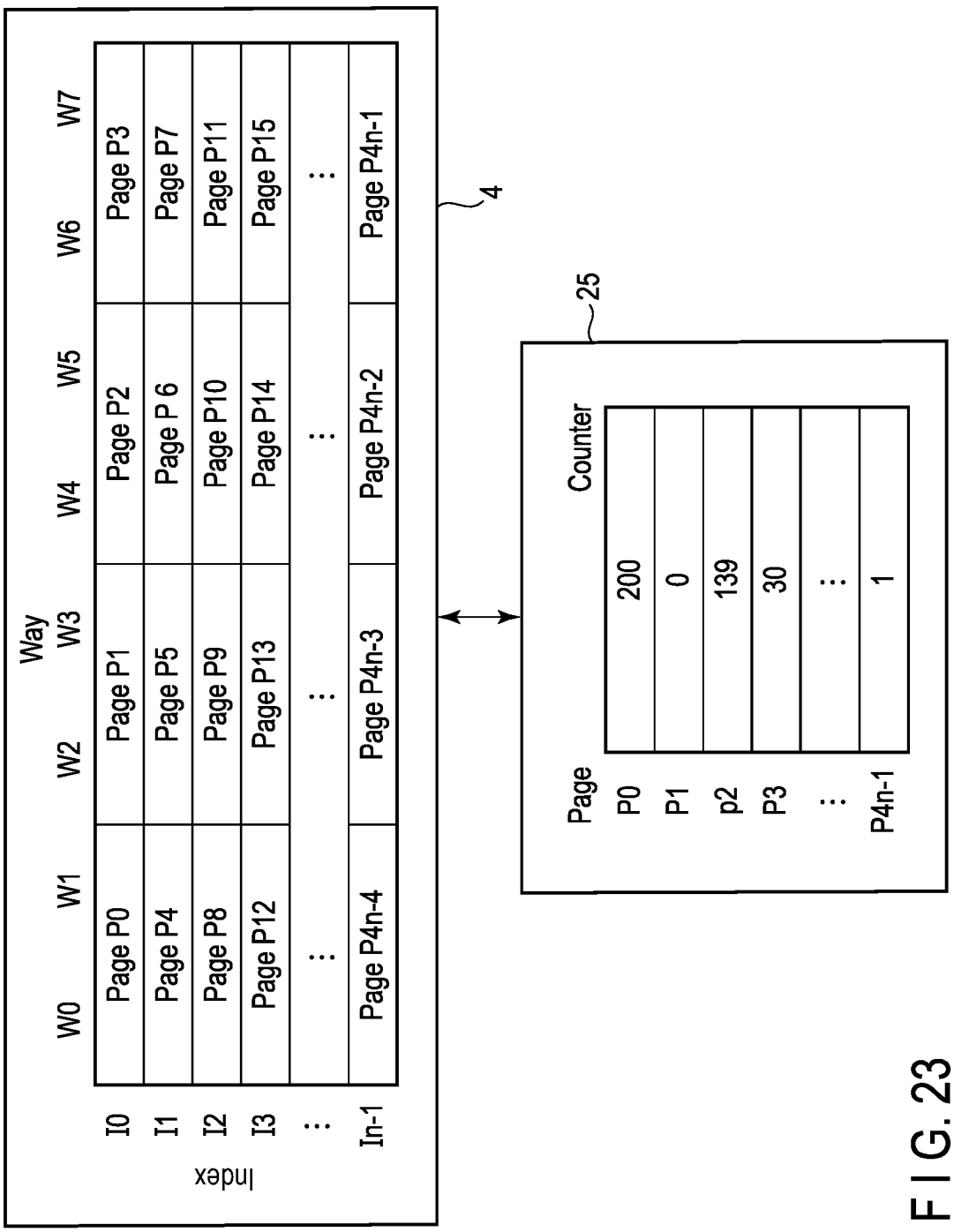
F I G. 23

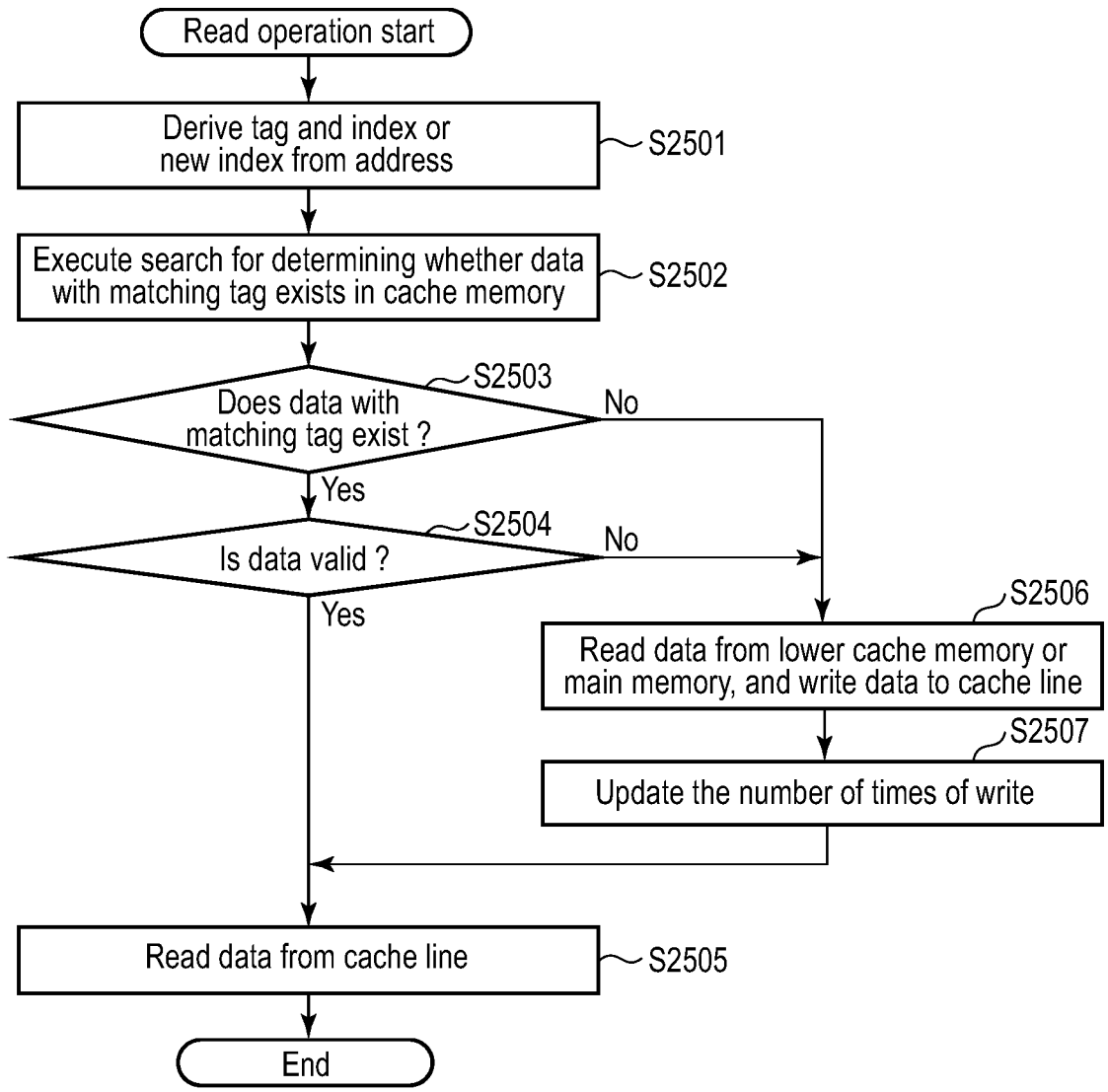
F I G. 25

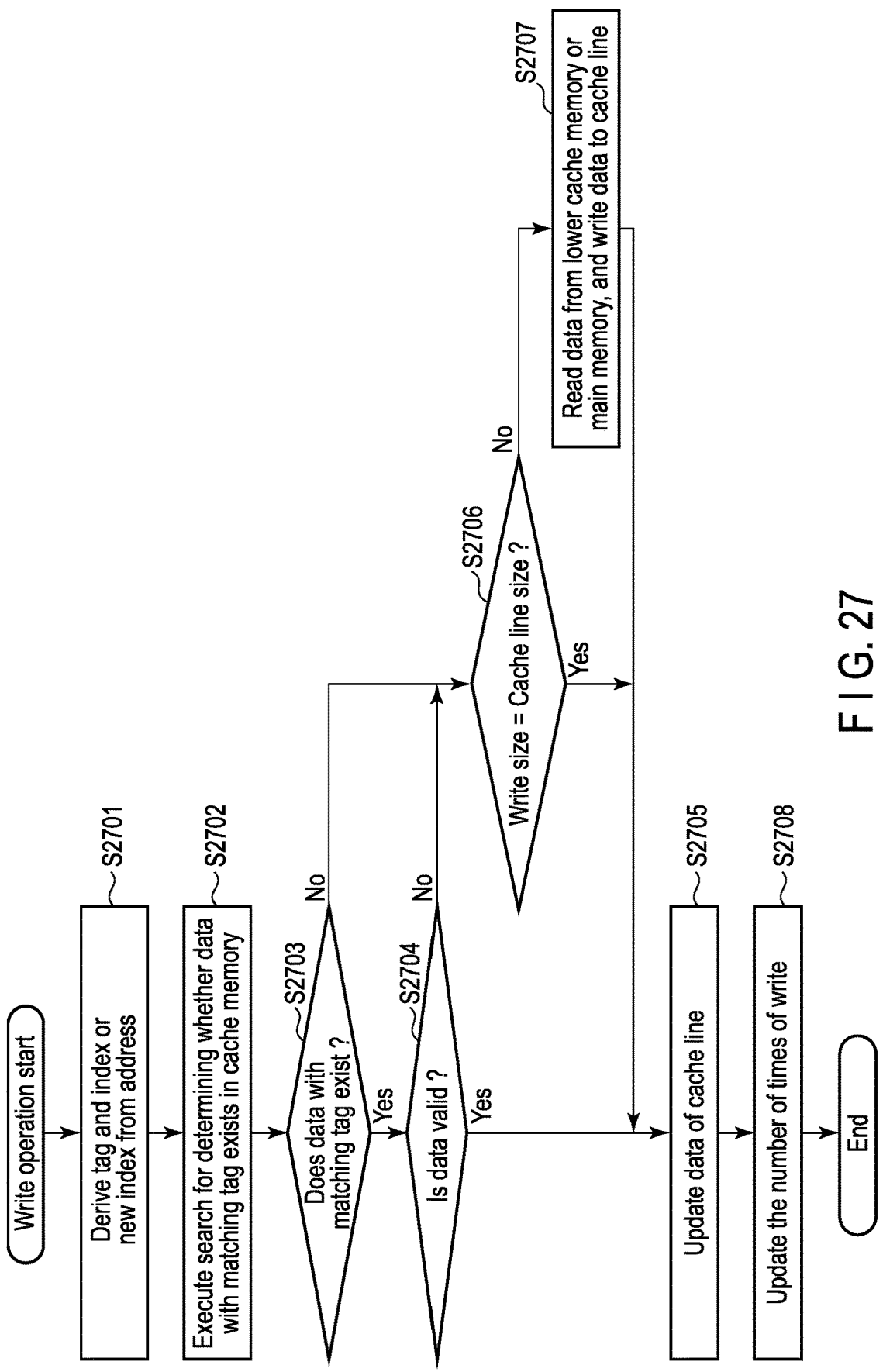
F I G. 27

CACHE MEMORY SYSTEM AND CACHE MEMORY CONTROL METHOD

CROSS-REFERENCE TO RELATED APPLICATIONS

This application is based upon and claims the benefit of priority from Japanese Patent Application No. 2020-156370, filed Sep. 17, 2020, the entire contents of which are incorporated herein by reference.

FIELD

Embodiments described herein relate generally to a cache memory system and a cache memory control method.

BACKGROUND

A cache memory system is used to accelerate processing of a central processing unit (CPU) or an accelerator. For example, the cache memory system stores data frequently used by the CPU or the accelerator in a cache memory. The cache memory is faster than a main memory.

BRIEF DESCRIPTION OF THE DRAWINGS

FIG. 1 is a block diagram illustrating an example of a configuration of an information processing device including a cache memory system according to a first embodiment.

FIG. 2 is a block diagram illustrating an implementation example of cache memory systems according to the first embodiment.

FIG. 3 is a block diagram illustrating an implementation example of cache memory systems according to the first embodiment.

FIG. 4 is a diagram illustrating an example of a N-way set-associative cache memory.

FIG. 7 is a diagram illustrating an example of a data management table in the cache memory in which the tag and the user data are arranged in separate areas.

FIG. 8 is a diagram for describing an example of deviations in the number of times of write occurring between areas of the cache memory.

FIG. 9 is a diagram illustrating a first example of a refresh executed in the cache memory system according to the first embodiment.

FIG. 10 is a diagram illustrating a second example of the refresh executed in the cache memory system according to the first embodiment.

FIG. 13 is a diagram illustrating an example of a first wear leveling on the cache memory executed by a refresh control unit, according to the first embodiment.

FIG. 14 is a diagram illustrating an example of a second wear leveling on the cache memory executed by a cache controller, according to the first embodiment.

FIG. 15 is a flowchart illustrating an example of the first wear leveling executed by the refresh control unit according to the first embodiment.

FIG. 16 is a flowchart illustrating an example of the second wear leveling executed by the cache controller according to the first embodiment.

FIG. 17 is a diagram illustrating an example of a relationship between an address received by the cache controller from a processor and a new index 24, according to the first embodiment.

FIG. 18 is a flowchart illustrating read operation executed by the cache controller according to the first embodiment.

FIG. 20 is a diagram illustrating an example of a refresh executed by a refresh control unit of a comparative example.

FIG. 21 is a flowchart illustrating an example of the refresh executed by the refresh control unit of the comparative example.

FIG. 23 is a diagram illustrating an example of a relationship between a cache memory and a counter according to the second embodiment.

FIG. 25 is a flowchart illustrating read operation executed by a cache controller according to the second embodiment.

FIG. 27 is a flowchart illustrating write operation executed by the cache controller according to the second embodiment.

DETAILED DESCRIPTION

Figure 5:
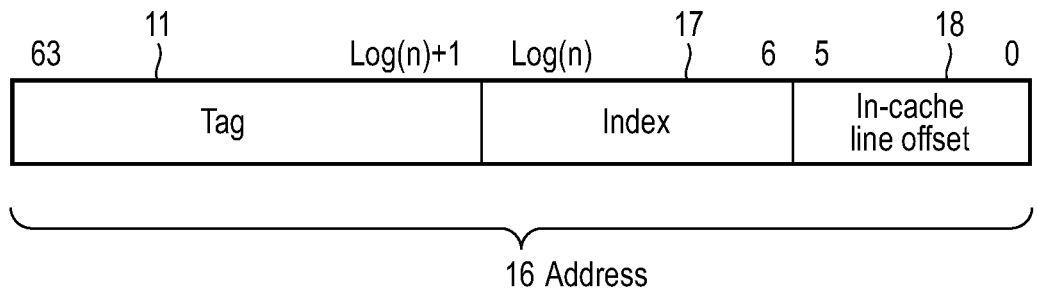
FIG. 5 is a diagram illustrating an example of a relationship between an address and a tag, an index, and an in-cache line offset used in an N-way set-associative cache.

An embodiment will be described hereinafter with reference to the accompanying drawings. In the following description, constituent elements having substantially the same function and configuration will be denoted by the same reference number, and description will be repeated only when necessary. Further, the following embodiment illustrates a device and a method which give concrete forms to technical ideas, and the technical ideas of the embodiment are not intended to limit materials, shapes, structures, arrangements, etc., of components to those descried below. The technical ideas of the embodiment can be modified in various manners in the scope of patent claims.

In general, according to one embodiment, a cache memory system includes a cache memory and a cache controller. The cache memory can store first data to be read or written by a processor. The cache controller is configured to execute a refresh. The refresh includes reading the first data stored in the cache memory and writing the read first data to the cache memory. When executing the refresh, the cache controller is configured to exchange the first data stored in a first area of the cache memory for second data stored in a second area of the cache memory.

First Embodiment

FIG. 1 is a block diagram illustrating an example of a configuration of an information processing device 100 including a cache memory system 1 according to a first embodiment.

The information processing device 100 includes a processor 2, a cache memory system 1, and a main memory 3.

The processor 2 may be, for example, a CPU, a microprocessing unit (MPU), a digital signal processor (DSP), a graphics processing unit (GPU), or the like.

Incidentally, the processor 2 may be, for example, a processor core included in a multi-core processor. The processor 2 may be, for example, an accelerator or an accelerator core.

For example, the cache memory system 1 can access data frequently used by the processor 2 at a high speed. In the cache memory system 1, various cache algorithms such as least frequently used (LFU), first in first out (FIFO), and least recently used (LRU) are used. The cache memory system 1 may be incorporated in the processor 2.

The cache memory system 1 may be applied to a storage class memory (SCM).

The cache memory system 1 includes a cache memory 4 and a cache controller 5.

The cache memory 4 partially stores data stored in the main memory 3. Further, the cache memory 4 stores data which is to be written from the processor 2 to the main memory 3 but has not yet been reflected in the main memory 3. The cache memory 4 may include at least one of SCMs such as a static random access memory (SRAM), an embedded dynamic access memory (eDRAM), and a magnetoresistive random access memory (MRAM) which are faster than the main memory 3, for example.

In the cache memory system 1, the cache memory 4 may be an N-way set-associative cache memory. Here, N is an integer of 2 or more.

The cache controller 5 exchanges data between the main memory 3 and the cache memory 4.

The cache controller 5 receives a memory access request from the processor 2.

In a case where the memory access request is a read request, and data to be read is stored in the cache memory 4, the cache controller 5 reads the data from the cache memory 4 and transfers the data to the processor 2.

In a case where the memory access request is the read request, and the data to be read is not stored in the cache memory 4, the cache controller 5 reads the data from the main memory 3, writes the data in the cache memory 4, and transfers the data to the processor 2. Incidentally, the cache controller 5 may read data from the main memory 3, transfer the data to the processor 2, and write the data in the cache memory 4.

In a case where the memory access request is a write request, the cache controller 5 writes data received from the processor 2 to the cache memory 4. Here, in a case where the cache line size of the cache memory 4 is larger than the write size of the data received from the processor 2 by the cache controller 5, the cache controller 5 may execute a read-modify-write in order to prevent loss of data of a portion not overlapping with the data received from the processor 2 in the cache line of a write destination. For example, in a case where the write size of the data written by the processor 2 is smaller than the cache line size, the cache controller 5 reads data corresponding to the cache line of the write destination from the main memory 3, writes the read data to the cache line of the write destination, and writes the data received from the processor 2 to the cache line of the write destination. Alternatively, in a case where the write size of the data written by the processor 2 is smaller than the cache line size, for example, the cache controller 5 reads data of a portion not overlapping with the data received from the processor 2 from the cache line of the write destination, writes the read data to the cache line of the write destination, and writes the data received from the processor 2 to the cache line of the write destination.

In the first embodiment, the cache line is an area specified by an index and a way in the cache memory 4. The cache line, the index, and the way will be described later with reference to FIG. 4.

The cache controller 5 writes data of the cache memory 4 to the main memory 3 (write back or write through).

The cache controller 5 includes a refresh control unit 6.

The refresh control unit 6 executes a refresh on the cache memory 4 at an arbitrary timing or periodically, for example. The refresh will be described later with reference to FIGS. 9 to 12 and the like.

In the first embodiment, when executing the refresh on the cache memory 4, the refresh control unit 6 executes first wear leveling for leveling wear of memory cells among a plurality of areas of the cache memory 4 based on information (hereinafter, referred to as deterioration information) indicating a progress state of deterioration such as the number of times of write, for example. The first wear leveling will be described later with reference to FIG. 13 and the like.

In the first embodiment, when the information processing device 100 is activated or when the information processing device 100 returns from a sleep state (for example, at the time of power recovery), the cache controller 5 executes second wear leveling for leveling deviations in the number of times of write among the plurality of areas for the cache memory 4. For example, in a case where the information processing device 100 enters the sleep state, the processor 2 and the cache memory system 1 transition to a power saving mode. In a case where the information processing device 100 ends the sleep state, the power saving mode of the processor 2 and the cache memory system 1 is released, and the cache controller 5 executes the second wear leveling. The second wear leveling will be described later with reference to FIG. 14 and the like.

The various processes implemented by the cache controller 5 may be implemented, for example, by a processor included in the cache controller 5 executing software.

The main memory 3 may be, for example, a dynamic access memory (DRAM), a high bandwidth memory (HBM), or an SCM. The SCM may be, for example, a phase change memory (PCM), an MRAM, or a resistive random access memory (ReRAM).

FIG. 2 is a block diagram illustrating an implementation example of cache memory systems 1A and 1B.

The cache memory system 1A is provided between a processor core 7 and the main memory 3. The cache memory system 1A includes a cache memory 4A and a cache controller 5A. The cache memory 4A and the cache controller 5A are similar to the cache memory 4 and the cache controller 5.

The cache memory system 1B is provided between an accelerator core 8 and the main memory 3. The cache memory system 1B includes a cache memory 4B and a cache controller 5B. The cache memory 4B and the cache controller 5B are similar to the cache memory 4 and the cache controller 5.

The cache controller 5A receives a memory access request from the processor core 7, receives data from the processor core 7, or transfers data to the processor core 7.

The cache controller 5A determines whether or not data is stored in the cache memory 4A (hit determination), and reads the data from the cache memory 4A in a case where the data is stored in the cache memory 4A.

The cache controller 5A reads data from the main memory 3 to the cache memory 4A (refill).

The cache controller 5A reads data from the cache memory 4A and writes the data to the main memory 3 (write back or write through).

The cache controller 5A of the cache memory system 1A manages cache coherency with the cache controller 5B of the cache memory system 1B, and ensures data consistency.

Incidentally, in a case where the processor core 7 is, for example, a CPU or the like and the accelerator core 8 is, for example, a GPU or the like, the cache controller 5A may not manage cache coherency with the cache memory system 1B.

The cache controller 5A executes the refresh of the cache memory 4A.

The cache controller 5A may perform error correction on data.

Since the cache memory system 1B is similar to the cache memory system 1A described above, the description thereof will be omitted.

FIG. 3 is a block diagram illustrating an implementation example of cache memory systems 1A to 1C.

The cache memory system 1C includes a cache memory 4C and a cache controller 5C. The cache memory 4C and the cache controller 5C are similar to the cache memory 4 and the cache controller 5.

The cache memory systems 1A and 1B are at cache level 1. The cache memory system 1C is at cache level 2.

In FIG. 3, the cache memory systems 1A and 1B are provided below the processor cores 9 and 10, respectively. The cache memory system 1C is provided below the cache memory systems 1A and 1B. The cache memory systems 1A and 1B at cache level 1 and the cache memory system 1C at cache level 2 have a hierarchical structure.

As described above, the cache memory systems 1A to 1C having a hierarchical structure is called a multi-level cache. The cache memory systems 1A and 1B at cache level 1 are faster than the cache memory system 1C at cache level 2, but a memory capacity of the cache memory systems 1A and 1B at cache level 1 is smaller than a small memory capacity of the cache memory system 1C at cache level 2. The cache memory system 1C at cache level 2 is accessed in a case where requested data is not stored in the cache memory systems 1A and 1B at cache level 1.

Similarly to the cache memory system 1 according to the first embodiment, the first and second wear leveling can be applied to each of the cache memory systems 1A to 1C configuring the multi-level cache as illustrated above in FIG. 3.

FIG. 4 is a diagram illustrating an example of the N-way set-associative cache memory 4.

Indexes I0 to In-1 are assigned to n areas of the cache memory 4, respectively.

Each area to which each of the indexes I0 to In-1 is assigned is further divided into N ways. In FIG. 4, each area to which each of the indexes I0 to In-1 is assigned is divided into four ways W0 to W3.

A tag 11, valid information 12, update information 13, history information 14, and user data 15 can be stored in each area (cache line) specified by one of the indexes I0 to In-1 and one of the ways W0 to W3.

The tag 11 is an identifier of data stored in the cache line. The cache line corresponds to a unit in which the processor 2 writes data to the main memory 3. The cache controller 5 performs hit determination in units of cache lines.

The valid information 12 is information (bit) indicating whether or not the user data 15 is valid.

The update information 13 is information (bit) indicating whether or not the user data 15 has been updated.

The history information 14 is information indicating a priority order of eviction from the cache memory 4.

In the example of FIG. 4, the tag 11, the valid information 12, the update information 13, the history information 14, and the user data 15 are stored in one cache line, but the tag 11, the valid information 12, the update information 13, the history information 14, and the user data 15 may be appropriately divided and stored in different areas.

FIG. 5 is a diagram illustrating an example of a relationship between an address 16 and the tag 11, the index 17, and in-cache line offset 18 used in the N-way set-associative cache.

The address 16 is, for example, 64 bit information. The cache controller 5 calculates, for example, the tag 11, the index 17, and the in-cache line offset (position) 18 from the address.

For example, information from 0 bits to 5 bits represents the offset 18, for example, information from 6 bits to Log (n) bits represents the index 17, and for example, information from Log (n)+1 bits to 63 bits represents the tag 11. Incidentally, the number of bits corresponding to the offset 18, the number of bits corresponding to the index 17, and the number of bits corresponding to the tag 11 can be changed as appropriate.

Figure 6:
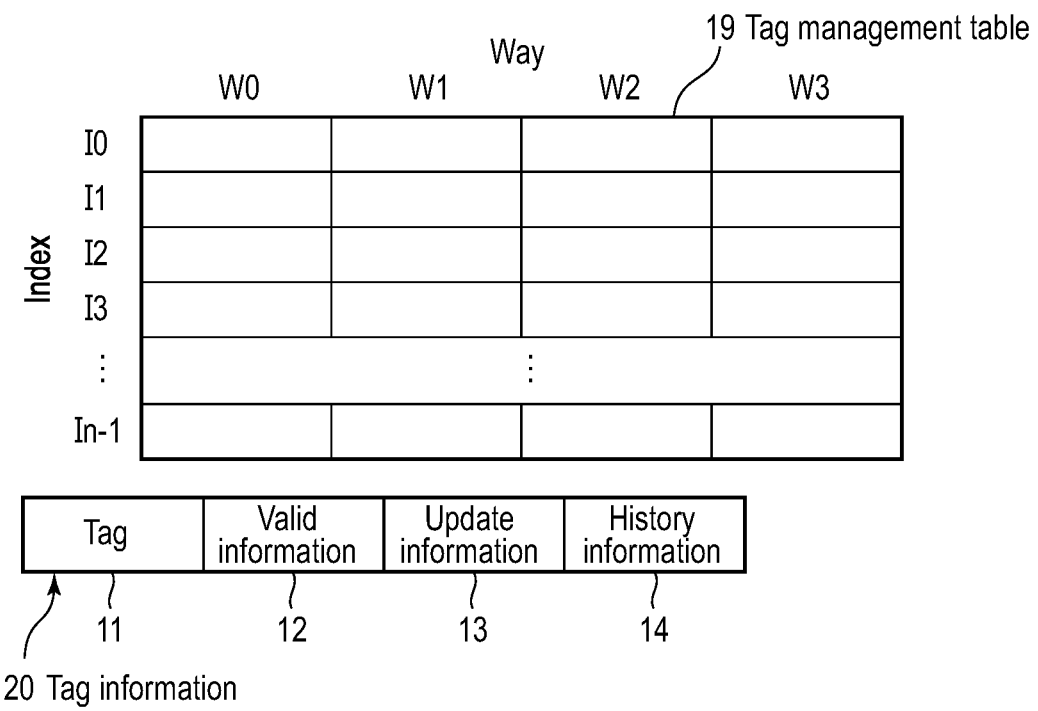
FIG. 6 is a diagram illustrating an example of a tag management table in a cache memory in which the tag and user data are arranged in separate areas.

FIG. 6 is a diagram illustrating an example of a tag management table 19 in the cache memory 4 in which the tag 11 and the user data 15 are arranged in separate areas.

The indexes I0 to In-1 are assigned to the n areas of the tag management table 19, respectively.

Each area to which each of the indexes I0 to In-1 is assigned in the tag management table 19 is further divided into N ways. In FIG. 6, each area to which each of the indexes I0 to In-1 is assigned is divided into four ways W0 to W3.

In the tag management table 19, the tag information 20 can be stored for each of a plurality of areas divided by the indexes I0 to In-1 and the ways W0 to W3. The tag information 20 may include, for example, the tag 11, the valid information 12, the update information 13, and the history information 14. The tag information 20 is metadata of the user data 15.

FIG. 7 is a diagram illustrating an example of a data management table 21 in the cache memory 4 in which the tag 11 and the user data 15 are arranged in separate areas.

The indexes I0 to In-1 are assigned to the n areas of the data management table 21, respectively.

Each area to which each of the indexes I0 to In-1 is assigned in the data management table 21 is further divided into N ways. In FIG. 7, each area to which each of the indexes I0 to In-1 is assigned is divided into four ways W0 to W3.

In the data management table 21, the user data 15 can be stored in each of the plurality of areas divided by the indexes I0 to In-1 and the ways W0 to W3.

The cache controller 5 may store the tag management table 19 to be always accessed by the cache controller 5 in the cache memory 4 such as an SRAM.

The cache controller 5 may store the data management table 21 having a data size larger than that of the tag management table 19 in the cache memory 4 such as an eDRAM or an SCM.

Incidentally, the tag 11, the valid information 12, the update information 13, the history information 14, and the user data 15 may be divided into combinations different from those in FIGS. 6 and 7, or may be divided into three or more groups.

FIG. 8 is a diagram for describing an example of deviations in the number of times of write occurring between the areas of the cache memory 4.

Due to spatial localities of access patterns to the cache memory 4, a deviation occurs in the number of times of write for each page of the cache memory 4. In the first embodiment, a case will be described in which the number of times of write between pages is leveled. However, for example, the number of times of write for each cache line of the cache memory 4 may be leveled.

Incidentally, the page is a unit (that is, a write unit area) of an area in which data can be stored in the cache memory 4 by one write. The page will be specifically described later with reference to FIG. 13.

In the first embodiment, a write to the cache memory 4 is enabled only in a page unit. In a case where the cache line size is smaller than a page size, the cache controller 5 executes a read-modify-write. Specifically, in a case where the cache line size is smaller than the page size, the cache controller 5 reads data corresponding to the entire page from the main memory 3, writes the data to the page of the cache memory 4, and updates the cache line (writes to the cache memory 4) with data received from the processor 2 in order to update the cache line. Alternatively, instead of reading the data corresponding to the entire page from the main memory 3 and updating the cache line, the cache controller 5 reads only data of a portion of the page not overlapping with the data received from the processor 2 and writes the data to the cache memory 4. By this read-modify-write, it is possible to prevent loss of the data of the portion which is stored in the same page and does not overlap with the data received from the processor 2.

The write to the cache line occurs when the cache controller 5 receives the write request from the processor 2, or the write to the cache line occurs when the refresh is executed. Further, in a case where the cache memory 4 is a destructive read type memory having a characteristic that data in the cache memory 4 is destroyed at the time of read, the write to the cache line also occurs at the time of read. In the cache memory 4 using the destructive read type memory, when data is read from a certain cache line, data held by a memory cell corresponding to the cache line is destroyed. Therefore, in order to maintain the data stored in the memory cell, it is necessary to read the data and then rewrite the read data to the cache line. Therefore, in a case where the destructive read type memory is used as the cache memory 4, the write also occurs at the time of read.

For example, the number of times of write for a cache line in which data having a high cache hit rate is stored is larger than the number of times of write for a cache line in which data having a low cache hit rate is stored.

The cache memory system 1 according to the first embodiment levels the deviations in the number of times of write between cache lines, and can operate stably even in a case where the cache memory 4 includes a memory having lower durability than an SRAM, an eDRAM, or the like.

FIG. 9 is a diagram illustrating a first example of a refresh executed in the cache memory system 1.

When the memory cell provided in the cache memory 4 is left, information of the memory cell may be lost due to, for example, discharge of charges in the memory cell.

In order to prevent such loss of information of the memory cell, for example, the refresh control unit 6 executes the refresh at an arbitrary timing or periodically by reading data from the cache memory 4 and rewriting the read data to the cache memory 4. Incidentally, the refresh may be referred to as retention.

FIG. 10 is a diagram illustrating a second example of the refresh executed in the cache memory system 1.

For example, the refresh control unit 6 transfers a refresh request to the cache memory 4. In a case where the refresh request is received from the refresh control unit 6, the cache memory 4 executes the refresh by reading and rewriting data.

Figure 11:
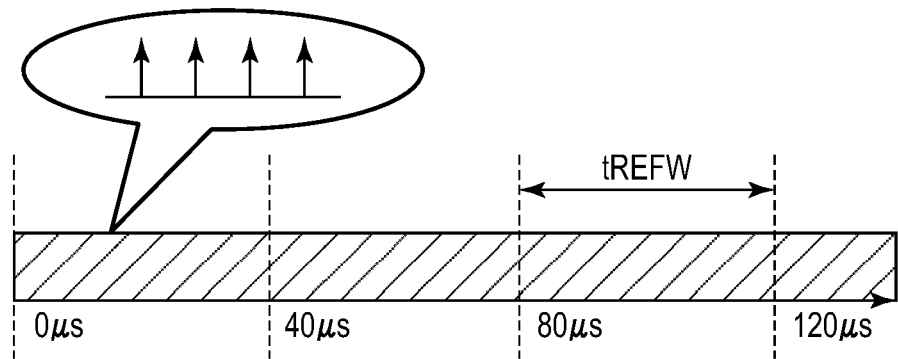
FIG. 11 is a diagram illustrating a first example of refresh execution timing.

FIG. 11 is a diagram illustrating a first example of refresh execution timing.

FIG. 11 illustrates a case where a refresh cycle tREFW is 40 microseconds, but the specific refresh cycle tREFW can be changed as appropriate.

The refresh control unit 6 may execute the refresh on each of a plurality of areas (for example, a plurality of pages) included in the cache memory 4 at regular intervals in the refresh cycle tREFW. The refresh control unit 6 executes the refresh on all the areas of the cache memory in the refresh cycle tREFW.

Figure 12:
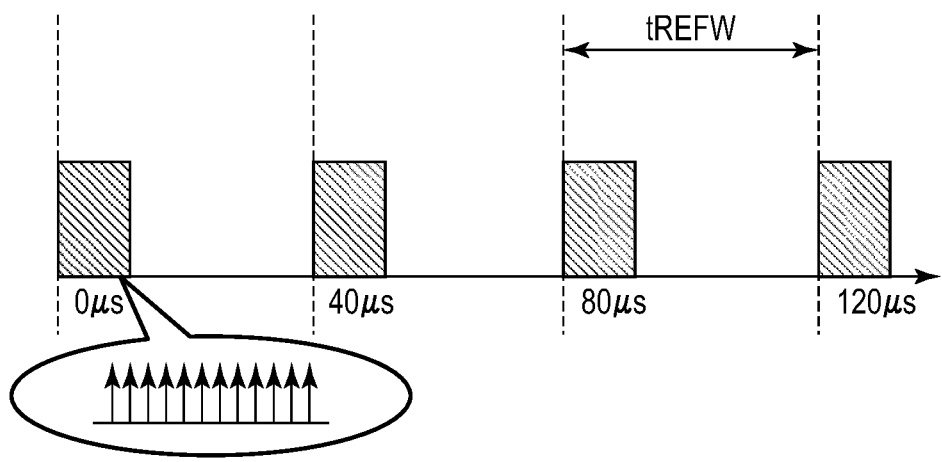
FIG. 12 is a diagram illustrating a second example of the refresh execution timing.

FIG. 12 is a diagram illustrating a second example of the refresh execution timing.

In FIG. 12, for example, the refresh control unit 6 may execute the refresh on the plurality of areas of the cache memory 4 together at the beginning of the refresh cycle tREFW.

Incidentally, the refresh execution timing is not limited to the examples of FIGS. 11 and 12, and various timings can be used.

FIG. 13 is a diagram illustrating an example of the first wear leveling on the cache memory 4 executed by the refresh control unit 6.

In FIG. 13, the cache memory 4 is a 4-way set-associative cache memory, and the size of the cache line may be, for example, 64 bytes and the size of the page may be, for example, 128 bytes.

In FIG. 13, the first wear leveling performed on the index I1 will be described as an example, but the first wear leveling performed on the other indexes I0, and I2 to In-1 is similar.

In the index I1, an area corresponding to two ways W0 and W1 is set as one page P0. In the index I1, an area corresponding to two ways W2 and W3 is set as one page P1.

The cache controller 5 writes data to the cache memory 4 in a unit of page.

When executing the refresh, the refresh control unit 6 stores data D0 stored in the page P0 corresponding to the index I1 in another page P1 corresponding to the same index I1, and stores data D1 stored in the page P1 corresponding to the index I1 in another page P0 corresponding to the same index I1. In other words, when executing the refresh, the refresh control unit 6 exchanges (shuffles) the data D0 and the data D1 between the page P0 and the page P1 corresponding to the same index I1.

In a case where three or more pages correspond to one index, the refresh control unit 6 may select a combination of pages for exchanging data from among the three or more pages.

Incidentally, in a case where the cache memory 4 is divided into the tag management table 19 and the data management table 21 as described above with reference to FIGS. 6 and 7, the refresh control unit 6 manages the exchange in the cache memory 4 so that the correspondence relationship (positional relationship) between the tag information 20 and the user data 15 does not collapse.

Specifically, in a case where the user data 15 is moved from a certain page to another page in the data management table 21, the refresh control unit 6 moves the tag information 20 corresponding to the moved user data 15 to a position corresponding to the movement destination of the user data 15 in the tag management table 19. The refresh control unit 6 can determine the position corresponding to the movement destination of the user data 15 in the tag management table 19 based on, for example, the index number and the way number of the movement destination of the user data 15 and the data size of the tag information 20.

Conversely, in a case where the tag information 20 is moved from a certain page to another page in the tag management table 19, the refresh control unit 6 moves the user data 15 corresponding to the moved tag information 20 to a position corresponding to the movement destination of the tag information 20 in the data management table 21. The refresh control unit 6 can determine the position corresponding to the movement destination of the tag information 20 in the data management table 21 based on, for example, the index number and the way number of the tag information 20 and the data size of the user data 15.

By the first wear leveling, the number of times of write of the page P0 and the number of times of write the page P1 can be leveled, and the number of times of write of each of the ways W0 to W3 can be leveled.

FIG. 14 is a diagram illustrating an example of the second wear leveling on the cache memory 4 executed by the cache controller 5.

When the information processing device 100 is activated or when the information processing device 100 returns from the sleep state, the cache controller 5 replaces (shuffles) the indexes I0 to In-1 assigned to the plurality of respective areas of the cache memory 4 with new indexes I12, In-1, I20, I0, . . . , I8. In other words, the cache controller 5 changes mappings of the indexes I0 to In-1 for the cache memory 4.

For example, the cache controller 5 derives new indexes I12, In-1, I20, I0, . . . , I8 for respective areas from the indexes I0, . . . , In-1 assigned to respective areas of the cache memory 4, and a translation equation 22 or a translation table 23, and manages the plurality of areas by the new indexes I12, In-1, I20, I0, . . . , I8.

In FIG. 14, the index I1 is initially assigned to pages P0 and P1. The index In-1 is assigned to the pages Pa and Pb. When the information processing device 100 is activated or when the information processing device 100 returns from the sleep state, the cache controller 5 assigns the index In-1 to the pages P0 and P1 and assigns the index I8 to the pages Pa and Pb.

With this second wear leveling, even in a case where there is a difference in the number of times of write among the indexes I0 to In-1, the number of times of write for each of a plurality of pages of the cache memory 4 can be leveled.

FIG. 15 is a flowchart illustrating an example of the first wear leveling executed by the refresh control unit 6.

In S1501, the refresh control unit 6 selects a refresh target page (which may be referred to as an exchange source page).

In S1502, the refresh control unit 6 selects an exchange destination page to which the same index as that of the refresh target page is assigned. Incidentally, the exchange destination page may be randomly determined from pages to which the same index as that of the refresh target page is assigned, or may be determined not randomly but according to a predetermined algorithm as in a second embodiment described later.

In S1503, the refresh control unit 6 exchanges data stored in the refresh target page for data stored in the exchange destination page (in particular, change first data stored in the refresh target page for second data stored in the exchange destination page, and change the second data stored in the exchange destination page for the first data).

In S1504, the refresh control unit 6 determines whether or not a refresh end condition that, for example, the refresh is executed as many times as the specified number of page is satisfied.

In a case where the refresh end condition is satisfied, the process ends.

In a case where the refresh end condition is not satisfied, the process returns to S1501.

FIG. 16 is a flowchart illustrating an example of the second wear leveling executed by the cache controller 5.

FIG. 16 is included in a cache memory initialization process called when the information processing device 100 is activated or when the information processing device 100 returns from the sleep state.

In S1601, the cache controller 5 derives new indexes from the indexes assigned to the plurality of respective areas of the cache memory 4 and the translation equation 22 or the translation table 23, and replaces the indexes of the plurality of areas with the new indexes.

FIG. 17 is a diagram illustrating an example of a relationship between the address 16 received by the cache controller 5 from the processor 2 and a new index 24.

In the case of receiving the read request or the write request and the address 16 from the processor 2, the cache controller 5 derives the new index 24 from the index 17 calculated from the address 16 and the translation equation 22 or the translation table 23. Then, the cache controller 5 reads data from the cache memory 4 or writes data to the cache memory 4 by using the tag 11 and the offset 18 calculated from the address 16, and the new index 24. As described above, even after replacement with the new index 24, the cache controller 5 can access the cache memory 4 by using the tag 11, the new index 24, and the offset 18.

Incidentally, a method of deriving the new index 24 described with reference to FIG. 17 is an example. For example, the new index 24 may be derived by various methods from the address 16. For example, the cache controller 5 may derive the new index 24 from not only the index 17 but also other information calculated from the address 16. For example, the cache controller 5 may derive the new index 24 from the entire address 16.

FIG. 18 is a flowchart illustrating read operation executed by the cache controller 5. In FIG. 18, a case where data is read from a cache line is described as an example. However, for example, as illustrated above in FIG. 13 and the like, the data may be read in a unit of page corresponding to a plurality of cache lines.

In S1801, the cache controller 5 derives the tag 11 and the index 17 or the new index 24 from the address 16 received from the processor 2. Here, the new index 24 may be derived in a case where the second wear leveling described above in FIG. 14 is executed once or more. Further, the cache controller 5 may derive the new index 24 even in a case where the second wear leveling is not executed even once in order to commonalize processing. For example, when the same index as an original index as the initial value of the translation table 23 is registered as the new index 24, the cache controller 5 can access the cache memory 4 by using the new index 24 even if the second wear leveling does not occur.

In S1802, the cache controller 5 executes a search for determining whether data with the matching tag 11 exists in the derived index 24 or the new index 24 in the cache memory 4.

In S1803, the cache controller 5 determines whether or not the data with the matching tag 11 exists in the cache memory 4 from a result of the search.

In a case where the data with the matching tag 11 does not exist in the cache memory 4, the process moves to S1806.

In a case where the data with the matching tag 11 exists in the cache memory 4, in S1804, the cache controller 5 determines whether or not the valid information 12 of the data with the matching tag 11 indicates validity.

In a case where the valid information 12 of the data does not indicate validity, the process moves to S1806.

In a case where the valid information 12 of the data indicates validity, in S1805, the cache controller 5 reads data from the cache line and transfers the data to the processor 2. Then, the process ends.

in a case where the data with the matching tag 11 does not exist in the above-described S1803 or in a case where the valid information 12 of the data does not indicate validity in the above-described S1804, in S1806, the cache controller 5 allocates a new cache line, reads data from a lower cache memory or the main memory 3, and writes the read data to the cache line of the cache memory 4.

In S1806, the cache controller 5 reads the user data 15 from the lower cache memory or the main memory 3, writes the user data to the cache line, and then updates the tag 11, the valid information 12, the update information 13, and the history information 14 corresponding to the user data 15. Further, in a case where there is no free way (free cache line) in the area corresponding to the derived index, the cache controller 5 selects a way for performing eviction in the derived index from the history information 14 of each of ways included in the area corresponding to the derived index. In a case where the update information 13 in the way in which eviction is performed indicates updated, the cache controller 5 writes the user data 15 of the way (the cache line in which eviction is performed) in which eviction is performed to the lower cache memory or the main memory 3.

In S1806, the lower cache memory may be controlled by the cache controller 5 or may be controlled by a cache controller lower than the cache controller 5. The main memory 3 may be controlled by the cache controller 5 or may be controlled by a memory controller for the main memory 3. After this S1806, the process moves to the above-described S1805.

Figure 19:
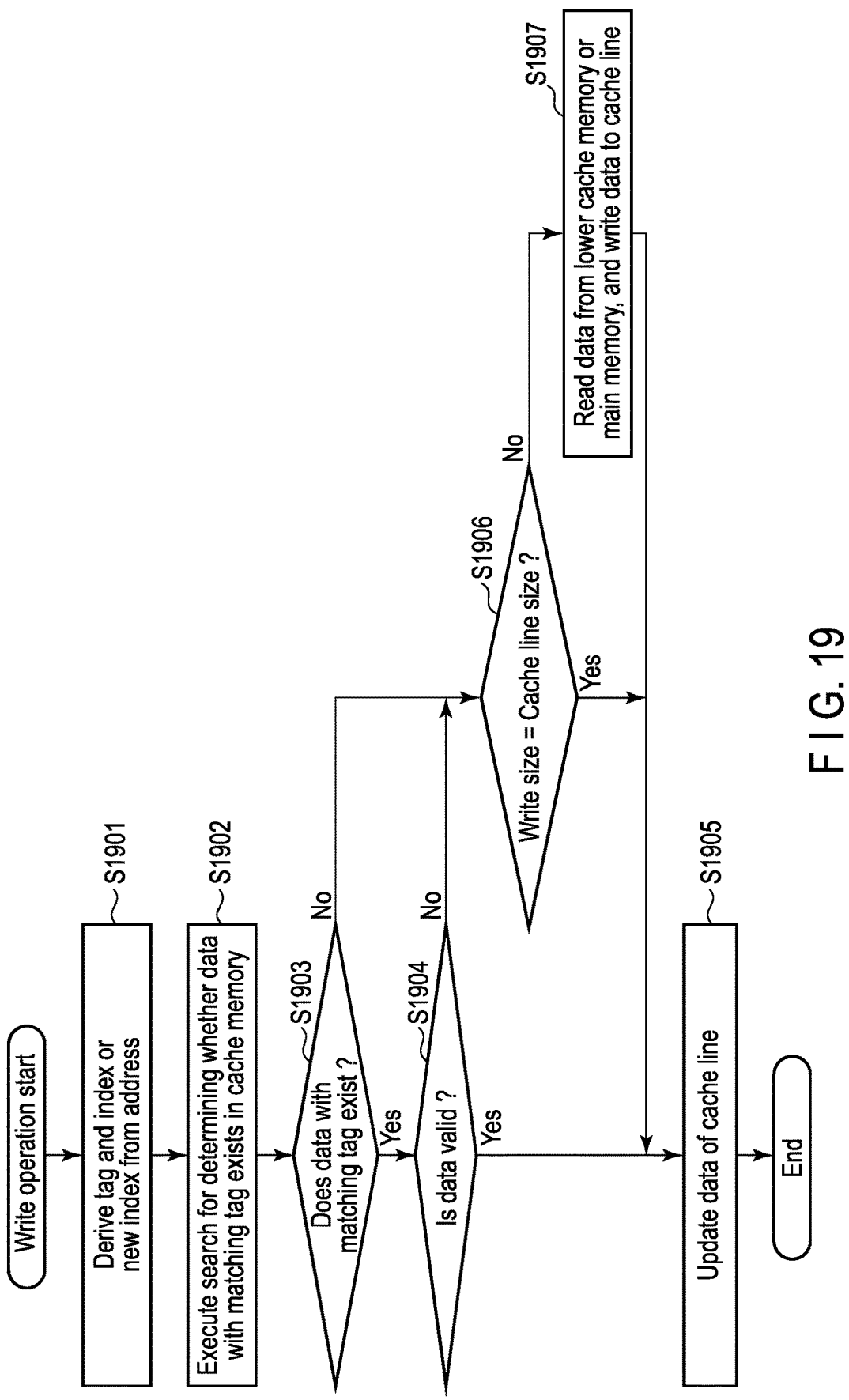
FIG. 19 is a flowchart illustrating write operation executed by the cache controller according to the first embodiment.

FIG. 19 is a flowchart illustrating write operation executed by the cache controller 5. In FIG. 19, a case where data is written to the cache line is described as an example. However, for example, as illustrated above in FIG. 13 and the like, the data may be written in a unit of a page corresponding to a plurality of cache lines.

In S1901, the cache controller 5 derives the tag 11 and the index 17 or the new index 24 from the address 16 received from the processor 2. Here, the new index 24 may be derived in a case where the second wear leveling described above in FIG. 14 is not executed or may be derived in a case where the second wear leveling is executed once or more.

In S1902, the cache controller 5 executes a search for determining whether or not the data with the matching tag 11 exists in the cache memory 4.

In S1903, the cache controller 5 determines whether or not the data with the matching tag 11 exists in the cache memory 4 from a result of the search.

In a case where the data with the matching tag 11 does not exist in the cache memory 4, the process moves to S1906.

In a case where the data with the matching tag 11 exists in the cache memory 4, in S1904, the cache controller 5 determines whether or not the valid information 12 of the data with the matching tag 11 indicates validity.

In a case where the valid information 12 of the data indicates invalidity, the process moves to S1906.

In a case where the valid information 12 of the data indicates validity, the cache controller 5 updates the data of the cache line in S1905. Then, the process ends.

In a case where the data with the matching tag 11 does not exist in the cache memory 4 in the above-described S1903 or in a case where the valid information 12 of the data indicates invalidity in the above-described S1904, in S1906, the cache controller 5 determines whether or not the size (hereinafter, referred to as a write size) of the data to be written is equal to the size of the cache line.

Here, the data is stored in the cache line. The data may include, for example, the tag 11, the valid information 12, the update information 13, the history information 14, and the user data 15 in FIG. 4. The data may be, for example, the tag information 20 of FIG. 6. The data may be, for example, the user data 15 in FIG. 7.

In a case where the write size is equal to the size of the cache line, the process moves to S1905.

In a case where the write size is not equal to the size of the cache line, the read-modify-write is required, and thus in S1907, the cache controller 5 reads data from the lower cache memory or the main memory 3 and writes the read data to the cache line of the cache memory 4.

In S1907, the lower cache memory may be controlled by the cache controller 5 or may be controlled by a cache controller lower than the cache controller 5. The main memory 3 may be controlled by the cache controller 5 or may be controlled by a memory controller for the main memory 3. After S1907, the process moves to S1905.

In the first embodiment described above, the number of times of write for each of a plurality of pages of the cache memory 4 can be leveled. As a result, the durability of the cache memory 4 can be improved, and the life of the cache memory 4 can be extended.

Hereinafter, effects obtained by the cache memory system 1 according to the first embodiment will be described by comparing the first wear leveling executed by the refresh control unit 6 and the second wear leveling executed by the cache controller 5 according to the first embodiment with a refresh executed by a refresh control unit of a comparative example.

FIG. 20 is a diagram illustrating an example of the refresh executed by the refresh control unit of the comparative example. FIG. 20 is illustrated under conditions similar to those in FIG. 13.

When executing the refresh, the refresh control unit of the comparative example reads the data D0 stored in the page P0 corresponding to the index I1 and rewrites the data D0 to the same page P0. Similarly, the refresh control unit of the comparative example reads the data D1 stored in the page P1 corresponding to the index I1 and rewrites the data D1 to the same page P1.

FIG. 21 is a flowchart illustrating an example of the refresh executed by the refresh control unit of the comparative example.

In S2101, the refresh control unit of the comparative example selects a refresh target page.

In S2102, the refresh control unit of the comparative example reads data from the refresh target page.

In S2103, the refresh control unit of the comparative example rewrites the data to the refresh target page.

In S2104, the refresh control unit of the comparative example determines whether or not a refresh end condition that, for example, the refresh is executed as many times as the specified number of page is satisfied.

In a case where the refresh end condition is satisfied, the process ends.

In a case where the refresh end condition is not satisfied, the process returns to S2101.

In the refresh executed by the refresh control unit of the comparative example as described above, the data of each page of the cache memory 4 is only read and rewritten in order, and the deviation in the number of times of write for each way is not leveled.

On the other hand, the refresh control unit 6 according to the first embodiment can level the number of times of write for each of the ways W0 to W3 by the first wear leveling described above with reference to FIG. 13. Further, even in a case where a difference in the number of times of write between the indexes I0 to In-1 occurs, the cache controller 5 can level the number of times of write for a plurality of pages of the cache memory 4 by executing the second wear leveling described above with reference to FIG. 14.

Second Embodiment

A second embodiment is a modification of the first embodiment. In the first embodiment, a case where page exchange is executed by the first wear leveling, for example, randomly has been described. On the other hand, in the second embodiment, for example, the exchange source page and the exchange destination page are selected according to the number of times of write.

Figure 22:
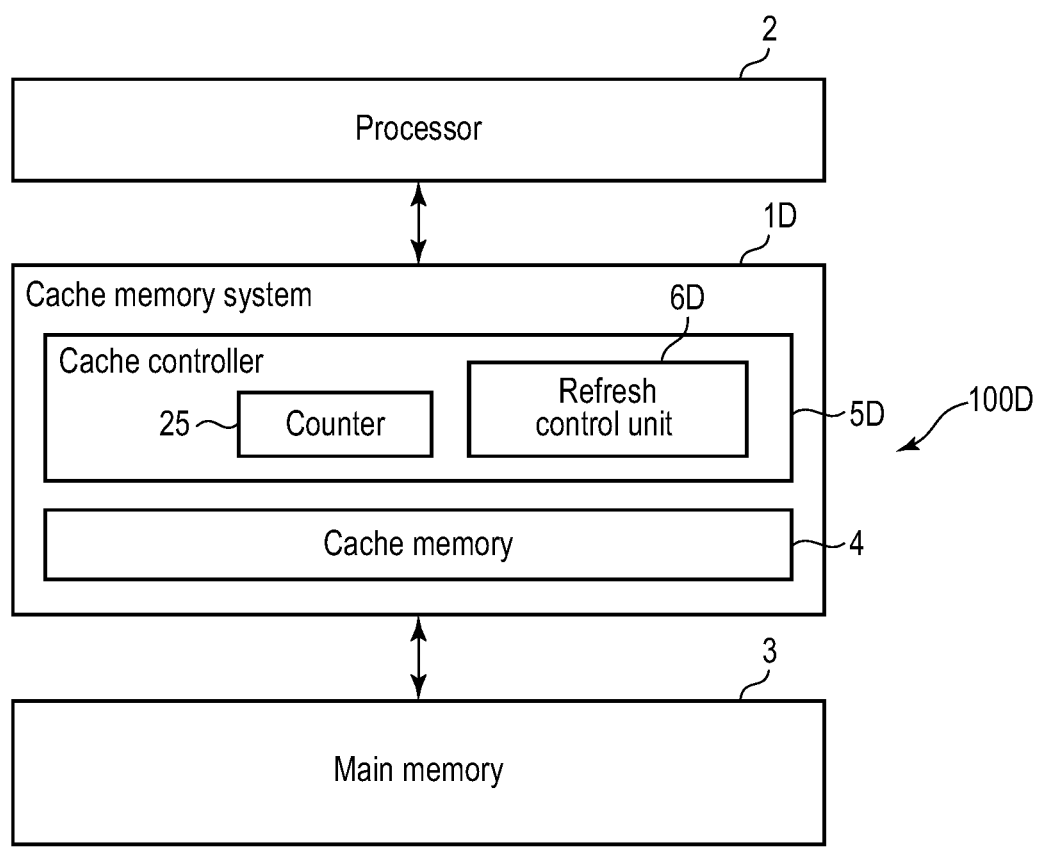
FIG. 22 is a block diagram illustrating an example of a configuration of an information processing device including a cache memory system according to a second embodiment.

FIG. 22 is a block diagram illustrating an example of a configuration of an information processing device 100D including a cache memory system 1D according to the second embodiment.

The information processing device 100D includes the processor 2, a cache memory system 1D, and the main memory 3.

The cache memory system 1D includes a cache memory 4 and a cache controller 5D.

The cache controller 5D includes a counter 25 and a refresh control unit 6D.

When data is written to a write destination area (for example, a page) of the cache memory 4, the cache controller 5D updates (for example, increment) the number of times of write regarding the write destination area.

The counter 25 stores the number of times of write for each of a plurality of areas of the cache memory 4.

In the first wear leveling, the refresh control unit 6D refers to the counter 25 and selects the exchange source page and the exchange destination page based on the number of times of write for each page.

Specifically, as a first page selection method, for example, the refresh control unit 6D may select a page with the maximum number of times of write as the exchange source page from among a plurality of pages to which the same index is assigned. For example, the refresh control unit 6D may select a page with the minimum number of times of write as the exchange destination page from among the plurality of pages to which the same index is assigned.

As a second page selection method, for example, the refresh control unit 6D may select a page with the number of times of write equal to or greater than a first threshold as the exchange source page from among the plurality of pages to which the same index is assigned. For example, the refresh control unit 6D may select a page with the number of times of write equal to or less than a second threshold as the exchange destination page from among the plurality of pages to which the same index is assigned.

As a third page selection method, for example, the refresh control unit 6D may select a page with the maximum number of times of write and the number of times of write equal to or greater than the first threshold as the exchange source page from among the plurality of pages to which the same index is assigned. Further, for example, the refresh control unit 6D may select another page which is not the exchange source page as the exchange destination page from among the plurality of pages to which the same index is assigned.

In the second embodiment, for example, the refresh control unit 6D exchanges data between the exchange source page and the exchange destination page selected according to the various selection methods as described above. However, similarly to the refresh of the comparative example described above with reference to FIG. 20, a refresh in which the position of the page is not changed may executed on the page to which the same index is assigned but which does not satisfy the selection condition defined based on various selection methods. More specifically, for example, in a case where the deterioration information satisfies a condition for determining whether or not to perform switching, the refresh control unit 6D selects an exchange source page and an exchange destination page and executes a refresh of performing exchange. For example, in a case where the deterioration information does not satisfy the condition, the refresh control unit 6D writes data of the refresh target page to the refresh target page. For example, without using the deterioration information, the refresh control unit 6D may execute a refresh of performing exchange only once in a predetermined number M of times, and executes a refresh without using exchange for a remaining number M−1 of times. Here, M is an integer of 2 or more.

FIG. 23 is a diagram illustrating an example of a relationship between the cache memory 4 and the counter 25. In FIG. 23, a case where the cache memory 4 is of an 8-way set-associative type is illustrated. Further, in FIG. 23, the size of one cache line is, for example, 64 bytes, the size of one page is, for example, 128 bytes, and two cache lines are allocated to one page.

A plurality of areas of the cache memory 4 are managed using n indexes I0 to In-1.

Each of n areas to which the indexes I0 to In-1 are respectively assigned is further divided into eight ways W0 to W7.

Specifically, an area corresponding to the index I0 and the ways W0 and W1 is the page P0. An area corresponding to the index I0 and the ways W2 and W3 is the page P1. An area corresponding to the index I0 and the ways W4 and W5 is the page P2. An area corresponding to the index I0 and the ways W6 and W7 is the page P3.

Incidentally, areas corresponding to the other indexes I1 to In-1 and the ways W0 to W7 similarly correspond to the pages P4 to P4n-1.

The counter 25 holds the number of times of write for each of the pages P0 to P4n-1.

In a case where the page size is 128 bytes, for example, a capacity of the cache memory 4 is 1 gibibyte, and the number of times of write is managed with 4 bytes per page, for example, 32 mebibytes of cache memory 4 is required for the counter 25 in order to manage the number of times of write for the pages P0 to P4n-1. In this case, 3.125% of the capacity of the cache memory 4 is required for the counter 25.

Figure 24:
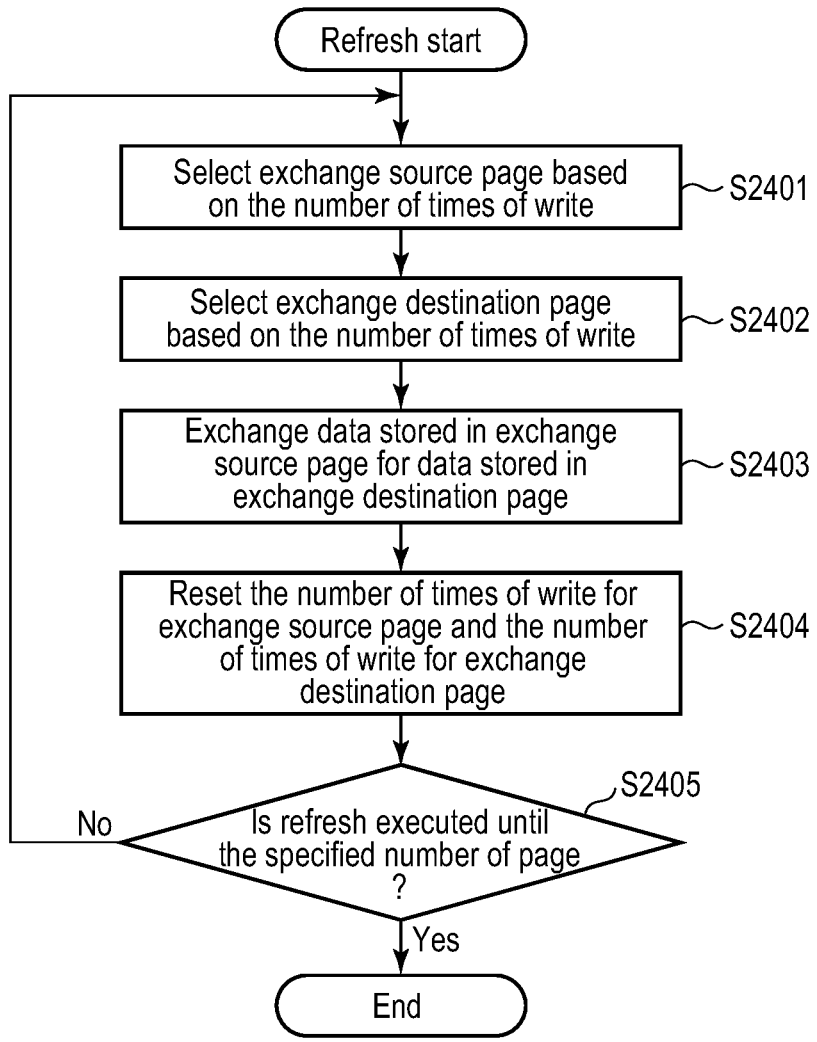
FIG. 24 is a flowchart illustrating an example of wear leveling executed by a refresh control unit according to the second embodiment.

FIG. 24 is a flowchart illustrating an example of wear leveling executed by the refresh control unit 6D.

In S2401, the refresh control unit 6D selects an exchange source page based on the number of times of write for each page stored in the counter 25.

In S2402, the refresh control unit 69 selects an exchange destination page to which the same index as that of the exchange source page is assigned based on the number of times of write for each page stored in the counter 25.

In S2403, the refresh control unit 6D exchanges the data stored in the exchange source page for the data stored in the exchange destination page.

In S2404, the refresh control unit 6D resets the number of times of write for the exchange source page and the number of times of write for the exchange destination page. Alternatively, the refresh control unit 6D may not reset the number of times of write for the exchange source page and the number of times of write for the exchange destination page. In this case, the refresh control unit 6D may use an accumulated value of the number of times of write for each page to select the exchange source page and the exchange destination page.

In S2405, the refresh control unit 6D determines whether or not a refresh end condition that, for example, the refresh is executed as many times as the specified number of page is satisfied.

In a case where the refresh end condition is satisfied, the process ends.

In a case where the refresh end condition is not satisfied, the process returns to S2401.

FIG. 25 is a flowchart illustrating read operation executed by the cache controller 5D.

Since S2501 to S2506 in FIG. 25 are similar to S1801 to S1806 in FIG. 18, the description thereof is omitted.

After S2506 of the read operation of FIG. 25, in S2507, the cache controller 5D updates (increments) the number of times of write regarding the cache line in which the data is written. Thereafter, the process moves to step S2505, and the cache controller 5D reads data (for example, the user data 15) from the cache line and transfers the data to the processor 2.

Figure 26:
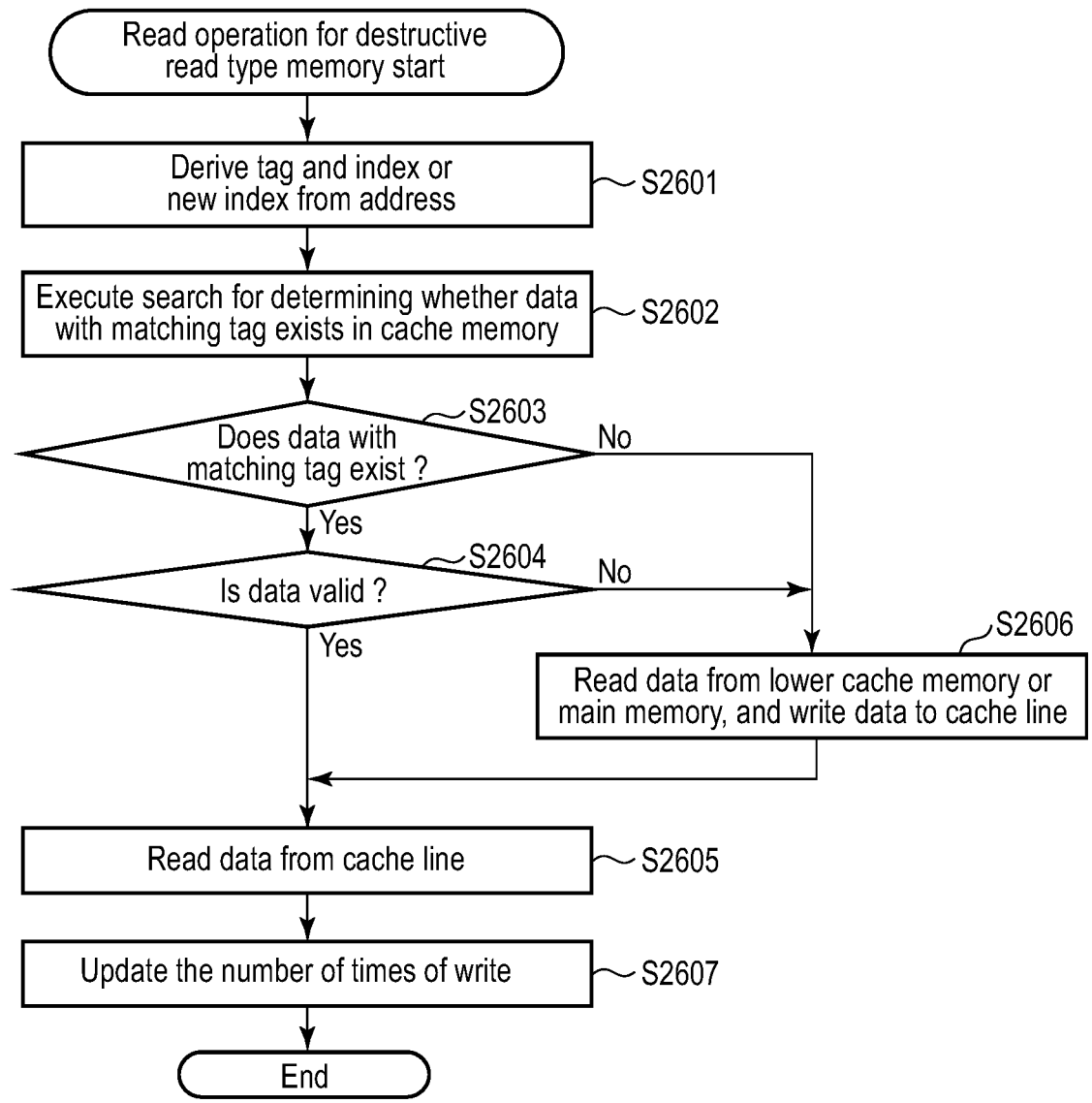
FIG. 26 is a flowchart illustrating read operation for a destructive read type memory executed by the cache controller according to the second embodiment.

FIG. 26 is a flowchart illustrating read operation for the destructive read type memory executed by the cache controller 5D.

Since S2601 to S2606 in FIG. 26 are similar to S1801 to S1806 in FIG. 18, the description thereof is omitted.

After 52605 in the read operation for the destructive read type memory in FIG. 26, in 52607, the cache controller 5D updates the number of times of write regarding the cache line in which a read is executed by the cache memory 4, and data is rewritten. Then, the process ends.

FIG. 27 is a flowchart illustrating write operation executed by the cache controller 5D.

Since S2701 to S2707 in FIG. 27 are similar to S1901 to S1907 in FIG. 19, the description thereof is omitted.

After 52705 in the write operation of FIG. 27, in S2708, the cache controller 5D updates the number of times of write regarding the written cache line. Then, the process ends.

In the second embodiment described above, the number of times of write is managed for each of a plurality of pages of the cache memory 4, and data stored in a page with a large number of times of write and data stored in a page with a small number of times of write are exchanged.

Therefore, the number of times of write for the plurality of pages of the cache memory 4 can be leveled, the durability of the cache memory 4 can be improved, and the life of the cache memory 4 can be extended.

Incidentally, in the second embodiment, a case where the exchange source page and the exchange destination page are selected according to the number of times of write has been described as an example. However, the cache controller 5D may manage various deterioration information such as a write frequency, the number of times of read, a read frequency, the number of error corrections, and an error rate, and select the exchange source page and the exchange destination page based on the deterioration information. In this case, the cache controller 5D may include a memory for recording deterioration information instead of the counter 25.

In the second embodiment, the modification of the first wear leveling is described. However, the second wear leveling may be appropriately modified. For example, the cache controller 5D may record deterioration information for each of the indexes I0 to In-1 and execute index replacement based on the deterioration information. More specifically, the cache controller 5D may record the deterioration information for each of the indexes I0 to In-1 and execute replacement between an index with a large value of the deterioration information and an index with a small value. Further, the cache controller 5D may record the deterioration information for each of the indexes I0 to In-1 and may execute replacement between an index with the deterioration information equal to or more than a third threshold and an index with the deterioration information equal to or less than a fourth threshold. The replacement relationship of the indexes I0 to In-1 may be managed by, for example, the translation table 23 or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cache memory system comprising:
a cache memory capable of storing first data to be read or written by a processor; and
a cache controller configured to execute a refresh, the refresh including reading the first data stored in the cache memory and writing the read first data to the cache memory, wherein
when executing the refresh, the cache controller is configured to exchange the first data stored in a first area of the cache memory for second data stored in a second area of the cache memory,
a first index is assigned to the first area,
the cache controller is configured to select the second area as an exchange destination from a plurality of areas to which the first index is assigned,
the cache memory includes the first area and the second area to which the first index is assigned and includes a third area and a fourth area to which a second index is assigned, and
when an information processing device including the processor is activated or when the information processing device returns from a sleep state, the cache controller is configured to assign the second index to the first area and the second area, and assign a third index to the third area and the fourth area.

2. The cache memory system according to claim 1, wherein
when receiving a read request or a write request and an address from the processor, the cache controller is configured to read data from the cache memory or write data to the cache memory by using an index derived from the address.

3. The cache memory system according to claim 1, wherein
the cache controller is configured to manage first deterioration information corresponding to the first area and second deterioration information corresponding to the second area, and select the first area and the second area for exchange based on the first deterioration information and the second deterioration information.

4. The cache memory system according to claim 3, wherein
the first deterioration information is the number of times of first write for the first area,
the second deterioration information is the number of times of second write for the second area, and
the cache controller is configured to select the first area as an exchange source in a case where the number of times of the first write is equal to or more than a first threshold, and select the second area as an exchange destination in a case where the number of times of the second write is equal to or less than a second threshold.

5. The cache memory system according to claim 1, wherein
the cache controller is configured to manage the number of times of write for each of the areas, select the first area with a maximum number of times of write as an exchange source among the areas to which the first index is assigned, and select the second area with a minimum number of times of write as the exchange destination among the areas to which the first index is assigned.

6. The cache memory system according to claim 1, wherein
the cache controller is configured to:
manage a plurality of pieces of deterioration information for each of a plurality of areas of the cache memory; and
select the first area and the second area for exchange based on the pieces of deterioration information.

7. The cache memory system according to claim 1, wherein
the cache controller is configured to:
select the first area and the second area and executes a refresh of exchange the first data for the second data in a case where a condition for determining whether or not to perform the exchange is satisfied; and
execute a refresh of writing the first data stored in the first area in the cache memory to the first area in a case where the condition is not satisfied.

8. The cache memory system according to claim 1, wherein
in a case where the first data is written to a write unit area of the cache memory, the cache controller reads third data corresponding to the write unit area from a main memory, writes the third data to the write unit area of the cache memory, and executes a read-modify-write for updating the write unit area with the first data received from the processor.

9. The cache memory system according to claim 1, wherein
the cache controller is configured to write the first data including a tag which is an identifier of data stored in a cache line, valid information, update information, history information, and the data to a cache line of the cache memory.

10. The cache memory system according to claim 1, wherein
the cache memory includes a first table and a second table,
the first table is a table for managing tag information including a tag which is an identifier of data stored in a cache line included in the cache memory, valid information, update information, and history information, and
the second table is a table for managing the data corresponding to the tag information.

11. The cache memory system according to claim 1, wherein the cache memory is an N-way set-associative cache memory.

12. A cache memory system comprising:
a cache memory capable of storing first data to be read or written by a processor; and
a cache controller configured to control the cache memory, wherein
the cache memory includes a first area and a second area to which a first index is assigned and includes a third area and a fourth area to which a second index is assigned, and
when an information processing device including the processor is activated or when the information processing device returns from a sleep state, the cache controller is configured to assign the second index to the first area and the second area, and assign a third index to the third area and the fourth area.

13. The cache memory system according to claim 12, wherein
the cache controller is configured to perform replacement of a plurality of indexes for a plurality of areas of the cache memory randomly, or based on a translation equation or a translation table.

14. The cache memory system according to claim 12, wherein
the cache controller is configured to manage deterioration information for each of a plurality of areas of the cache memory, and perform replacement of a plurality of indexes for the plurality of areas based on the deterioration information.

* * * * *